(12) United States Patent
Goto et al.

(10) Patent No.: US 10,714,549 B2
(45) Date of Patent: Jul. 14, 2020

(54) ORGANIC EL DISPLAY PANEL MANUFACTURING METHOD AND ORGANIC EL DISPLAY PANEL

(71) Applicant: JOLED INC., Tokyo (JP)

(72) Inventors: Masashi Goto, Tokyo (JP); Yoichi Shintani, Higashi-Hiroshima (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/282,602

(22) Filed: Feb. 22, 2019

(65) Prior Publication Data
US 2019/0267438 A1 Aug. 29, 2019

(30) Foreign Application Priority Data
Feb. 23, 2018 (JP) .................. 2018-030948

(51) Int. Cl.
| | |
|---|---|
| *H01L 21/00* | (2006.01) |
| *H01L 27/32* | (2006.01) |
| *H01L 51/00* | (2006.01) |
| *H01L 51/56* | (2006.01) |
| *H01L 51/50* | (2006.01) |

(52) U.S. Cl.
CPC ........ *H01L 27/3246* (2013.01); *H01L 27/322* (2013.01); *H01L 27/3211* (2013.01); *H01L 27/3223* (2013.01); *H01L 51/0005* (2013.01); *H01L 51/5036* (2013.01); *H01L 51/56* (2013.01); *H01L 2227/323* (2013.01)

(58) Field of Classification Search
CPC . H01L 27/3246; H01L 27/3211; H01L 27/322
See application file for complete search history.

(56) References Cited

U.S. PATENT DOCUMENTS

| | | | | |
|---|---|---|---|---|
| 5,443,922 | A * | 8/1995 | Nishizaki | H05B 33/14 428/690 |
| 10,014,354 | B2 * | 7/2018 | Kondo | H01L 51/5271 |
| 10,084,027 | B2 * | 9/2018 | Kondo | H01L 27/3211 |
| 10,229,959 | B2 * | 3/2019 | Abe | H01L 27/322 |
| 10,553,805 | B2 * | 2/2020 | Maeda | H01L 51/5056 |
| 2007/0200488 | A1 * | 8/2007 | Ito | F21K 2/06 313/500 |
| 2014/0306198 | A1 * | 10/2014 | Im | H01L 51/0013 257/40 |

(Continued)

FOREIGN PATENT DOCUMENTS

| | | |
|---|---|---|
| JP | H5-163488 A | 6/1993 |
| JP | 2007-234232 A | 9/2007 |

(Continued)

*Primary Examiner* — Laura M Menz
(74) *Attorney, Agent, or Firm* — Hauptman Ham, LLP

(57) ABSTRACT

An organic EL display panel including organic light emitting layers, each continuous in a column direction, in gaps between column banks. The organic light emitting layer in a gap end region extending in the column direction from a column direction end of the gap to a reference position a defined distance from the column direction end towards a display region and within a peripheral region has a volume greater than volumes of the organic light emitting layers in gap end regions extending in the column direction from column direction ends of the gaps to the reference position.

29 Claims, 23 Drawing Sheets

(56) References Cited

U.S. PATENT DOCUMENTS

| | | | |
|---|---|---|---|
| 2015/0053948 A1* | 2/2015 | Matsushima | H01L 51/0004 257/40 |
| 2016/0079323 A1* | 3/2016 | Choi | H01L 27/3246 257/40 |
| 2017/0069696 A1* | 3/2017 | Kondo | H01L 27/3276 |
| 2017/0084632 A1* | 3/2017 | Shinokawa | G09F 9/30 |
| 2017/0213881 A1* | 7/2017 | Kondo | H01L 51/5228 |
| 2018/0233694 A1* | 8/2018 | Ajiki | H01L 51/5228 |
| 2018/0286935 A1* | 10/2018 | Kondo | H01L 27/3276 |
| 2018/0358573 A1* | 12/2018 | Maeda | H01L 51/0005 |
| 2018/0374909 A1* | 12/2018 | Nishikiori | H01L 27/3223 |
| 2019/0267438 A1* | 8/2019 | Goto | H01L 27/322 |
| 2019/0305055 A1* | 10/2019 | Kim | H01L 27/3246 |
| 2019/0371872 A1* | 12/2019 | Nendai | H01L 27/32 |

FOREIGN PATENT DOCUMENTS

| | | | | |
|---|---|---|---|---|
| JP | 2010-277944 A | | 12/2010 | |
| JP | 2019145464 A | * | 8/2019 | H01L 51/5036 |

* cited by examiner

ORGANIC EL DISPLAY PANEL MANUFACTURING METHOD AND ORGANIC EL DISPLAY PANEL

This application claims priority to Japanese Patent Application No. 2018-030948 filed Feb. 23, 2018, the contents of which are hereby incorporated by reference in their entirety.

BACKGROUND OF THE DISCLOSURE

Technical Field

The present disclosure relates to methods of manufacturing organic electroluminescence (EL) display panels that include organic EL elements that make use of electroluminescence of an organic material, and to organic EL display panels.

Description of the Related Art

In recent years, organic EL display panels in which organic EL elements are arranged in a matrix on a substrate have been implemented as display panels used in display devices such as digital televisions. Such organic EL display panels have high visibility because each organic EL element emits light.

In such organic display panels, typically light emitting layers of the organic EL elements are separated from each other by insulating layers made of an insulating material. In color display organic EL display panels, such organic EL elements form RGB color subpixels, and sets of adjacent RGB subpixels form unit pixels of the color display. Each organic EL element has a structure in which a functional film such as a light emitting layer containing an organic light emitting material is disposed between an anode and a cathode electrode pair. When driven, a voltage is applied across the pair of electrodes and the organic EL element emits light in accordance with recombination of holes injected from the anode and electrons injected from the cathode into the functional film.

In recent years, as device size has increased, wet processes in which ink containing a functional material is applied by an inkjet method or the like have been proposed as efficient film forming methods.

In a typical inkjet wet process, an inkjet head is scanned in one direction with respect to a surface of a substrate placed on a work table of an application device, while ink is dropped in defined regions of the surface from nozzles of the inkjet head, and subsequently solvent of the ink is evaporated and dried to form the functional film. For example, as described in JP 2007-234232, an organic material solution of a constant concentration is dropped between banks in a Y direction, and by applying a solution amount corresponding to a volume between the banks, homogeneous organic light emitting layers can be formed by a simple and easy process.

However, in such a wet process in which a functional film is formed by applying and drying ink on a substrate, in the process of evaporating and drying solvent of the ink, an evaporation rate of the solvent is higher in a peripheral portion of a film forming area than in a central portion of the film forming area because solvent vapor concentration is lower. As a result, the functional layer of a pixel formed at the central portion of the substrate and the functional layer of a pixel formed at the peripheral portion of the substrate tend to have different film thicknesses. When film thicknesses are different between pixels in the central portion of the substrate and pixels in the peripheral portion of the substrate, properties of the functional layers are different from each other, which becomes a cause of in-plane luminance unevenness in an organic EL display panel.

To address this, JP 2010-277944 describes an organic EL display panel having reduced luminance unevenness by improvement of organic layer shape evenness through provision of a non-light-emitting region (dummy region) surrounding a display element region on a substrate, and application of ink or solvent onto the non-light-emitting region, thereby improving solvent evaporation concentration evenness.

SUMMARY

An organic EL display panel pertaining to an aspect of the present disclosure is an organic EL display panel in which pixels are arranged in a matrix of rows and columns. The organic EL display panel includes a substrate, individual electrodes, column banks, organic light emitting layers, and a counter electrode layer. The individual electrodes are disposed above the substrate and arranged in the matrix. The column banks are disposed above the substrate at least between row direction edges of the individual electrodes, the column banks extending in the column direction and arranged side by side along the row direction. The organic light emitting layers are disposed in gaps between the column banks and are each continuous in the column direction between column direction ends of the column banks. A first organic light emitting layer among the organic light emitting layers is disposed in a first gap selected from the gaps and a second organic light emitting layer among the organic light emitting layers is disposed in a second gap selected from the gaps. The second gap is adjacent to the first gap in the row direction with one of the column banks therebetween. The counter electrode layer is disposed above the organic light emitting layers. The individual electrodes consist of pixel electrodes disposed in a display region centrally located in plan view of the substrate and dummy electrodes disposed in a peripheral region surrounding the display region. In plan view of the substrate, the first organic light emitting layer in a first gap end region extending in the column direction from a column direction end of the first gap to a reference position a defined distance from the column direction end of the first gap towards the display region and within the peripheral region has a volume greater than a volume of the second organic light emitting layer in a second gap end region extending in the column direction from a column direction end of the second gap to the reference position.

Further, a method of manufacturing an organic EL display panel pertaining to an aspect of the present disclosure is a method of manufacturing an organic EL display panel in which pixels are arranged in a matrix of rows and columns. The method includes preparing a substrate, forming individual electrodes above the substrate arranged in the matrix, forming column banks, applying inks, forming organic light emitting layers, and forming a counter electrode layer. The column banks are formed above the substrate at least between row direction edges of the individual electrodes, extending in the column direction and arranged side by side along the row direction; The inks are applied into gaps between the column banks including a first gap and a second gap, such that a first ink including a first organic light emitting material is applied to an entire length of the first gap between column direction ends of the column banks and a second ink including a second organic light emitting material is applied to an entire length of the second gap between column direction ends of the column banks. The second gap is adjacent to the first gap in the row direction with one of the column banks therebetween and the second organic light emitting material is different from the first organic light emitting material. The organic light emitting layers include a first organic light emitting layer formed by drying the first ink and a second organic light emitting layer formed by drying the second ink. The counter electrode layer is formed above the organic light emitting layers. The individual electrodes consist of pixel electrodes and dummy electrodes, and in the forming of the individual electrodes, the pixel electrodes are disposed in a display region centrally located in plan view of the substrate and the dummy electrodes are disposed in a peripheral region surrounding the display region. In the forming of the organic light emitting layers, in plan view of the substrate, the first organic light emitting layer in a first gap end region extending in the column direction from a column direction end of the first gap to a reference position a defined distance from the column direction end of the first gap towards the display region and within the peripheral region is made to have a volume greater than a volume of the second organic light emitting layer in a second gap end region extending in the column direction from a column direction end of the second gap to the reference position.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 1.6A illustrates film thickness measurement results for organic light emitting layers 123R, 123G, 123B near column bank ends of a region 10e of organic EL display panel 10 according to at least one embodiment.

DETAILED DESCRIPTION

Figure 1:
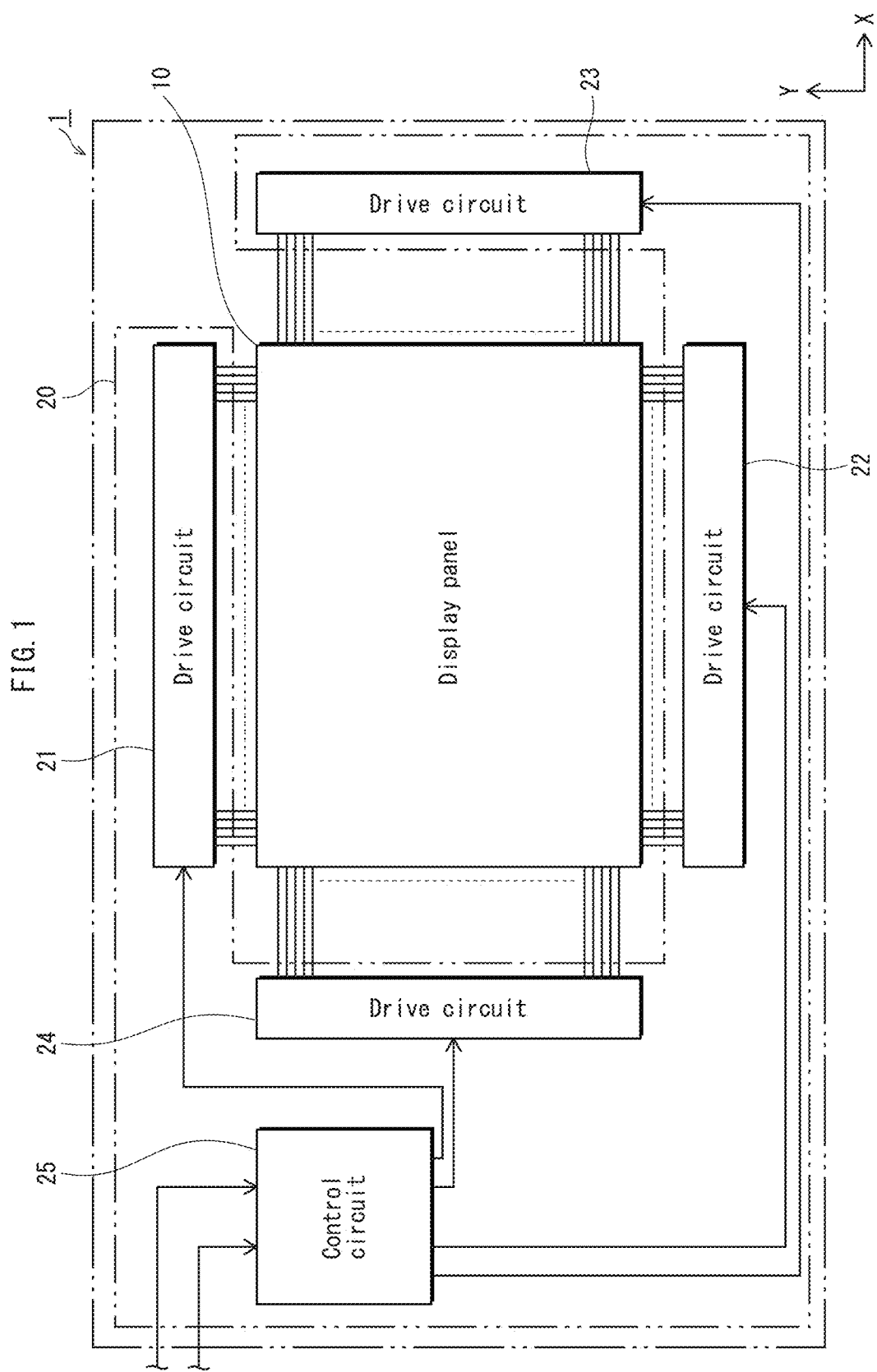
FIG. 1 is a schematic block diagram illustrating a circuit structure of an organic EL display device 1 according to at least one embodiment.

<<Background to Embodiments of the Present Disclosure>>

In an organic EL display panel having a structure as described in JP 2007-234232, mentioned above, in which application regions elongated in a column direction are defined by gaps between two or more parallel insulating layers elongated in the column direction in a display element region, and ink including organic light emitting material is applied to the application regions to form organic functional layers, even when a non-light-emitting region is provided surrounding the display element region, film thicknesses of the organic functional layers become non-uniform near end portions of the application regions, which is a factor causing luminance unevenness. Further, there is a problem that the degree of film thickness variance near the column direction end portions is different for each color (RGB) of organic light emitting layer, and therefore luminance unevenness near the column direction end portions varies for each color and can be visibly recognized as a change in color tone.

The present disclosure is made in view of the above-described problems, and an object of the present disclosure is to provide an organic EL display panel and an organic EL display panel manufacturing method that can reduce variation in film thicknesses of organic light emitting layers near column direction end portions, and thereby suppress unevenness in light emission properties near column direction end portions.

<<Overview of Embodiments>>

An organic EL display panel pertaining to at least one embodiment of the present disclosure is an organic EL display panel in which pixels are arranged in a matrix of rows and columns. The organic EL display panel includes a substrate, individual electrodes, column banks, organic light emitting layers, and a counter electrode layer. The individual electrodes are disposed above the substrate and arranged in the matrix. The column banks are disposed above the substrate at least between row direction edges of the individual electrodes, the column banks extending in the column direction and arranged side by side along the row direction. The organic light emitting layers are disposed in gaps between the column banks and are each continuous in the column direction between column direction ends of the column banks. A first organic light emitting layer among the organic light emitting layers is disposed in a first gap selected from the gaps and a second organic light emitting layer among the organic light emitting layers is disposed in a second gap selected from the gaps. The second gap is adjacent to the first gap in the row direction with one of the column banks therebetween. The counter electrode layer is disposed above the organic light emitting layers. The individual electrodes consist of pixel electrodes disposed in a display region centrally located in plan view of the substrate and dummy electrodes disposed in a peripheral region surrounding the display region. In plan view of the substrate, the first organic light emitting layer in a first gap end region extending in the column direction from a column direction end of the first gap to a reference position a defined distance from the column direction end of the first gap towards the display region and within the peripheral region has a volume greater than a volume of the second organic light emitting layer in a second gap end region extending in the column direction from a column direction end of the second gap to the reference position.

According to at least one embodiment of the organic EL display panel, average film thickness of the first organic light emitting layer in the display region is greater than average film thickness of the second organic light emitting layer in the display region.

According to this structure, in a panel structure in which functional layers elongated in the column direction are arranged side by side, a difference of magnitude of film thickness variation near the column direction ends of the display element region 10e between the first organic light emitting layer and the second organic light emitting layer can be reduced. As a result, a difference between the first organic light emitting layer and the second organic light emitting layer in terms of luminance unevenness near column direction ends of the display element region 10e is reduced, and unevenness in light emission properties near the column direction ends can be suppressed.

According to at least one embodiment of the organic EL display panel, a wavelength of light emitted by the first organic light emitting layer is longer than a wavelength of light emitted by the second organic light emitting layer.

According to at least one embodiment of the organic EL display panel, a ratio of the volume of the first organic light emitting layer in the first gap end region to average film thickness in the display region of the first organic light emitting layer is greater than a ratio of the volume of the second organic light emitting layer in the second gap end region to average film thickness in the display region of the second organic light emitting layer.

According to this structure, even in a case in which for each RGB subpixel, the optical distance between the top surface of a light emitting layer and the top surface of a pixel electrode is set according to a wavelength of light to be emitted by the subpixel in order to form an optical resonator structure for constructive interference for each color of light component, a difference of magnitude of film thickness variation of organic light emitting layers near the column direction ends of the display element region 10e between the first organic light emitting layer and the second organic light emitting layer can be reduced.

According to at least one embodiment of the organic EL display panel, length in the column direction of the first gap end region is greater than length in the column direction of the second gap end region.

According to this structure, positions in the column direction of column direction ends of gaps in a non-light-emission region 10ne are different depending on light emission colors of the light emitting layers disposed in the gaps, and said positions of the column direction ends are set such that distance from the column direction edge of the region 10e is in the order of distance for the first organic light emitting layer>distance for the second organic light emitting layer, i.e., the position of the column direction end of the first organic light emitting layer is nearest the column direction edge of the substrate 100x. Thus, a difference of magnitude of film thickness variation near the column direction ends of the display element region 10e between the first organic light emitting layer and the second organic light emitting layer can be reduced.

According to at least one embodiment of the organic EL display panel, in plan view of the substrate, at least one region selected from the first gap end region and the second gap end region bends in the row direction.

According to this structure, even in a case where column direction length of the substrate 100x is short, the limited space can be used effectively, and a distance between the column direction ends of the gaps 522z in the region 10e and the column direction ends 522zend of the gaps 522z can be set such that the distance of the first gap end region>the distance of the second gap end region.

According to at least one embodiment of the organic EL display panel, a portion of a top surface of the substrate corresponding to at least one region selected from the first gap end region and the second gap end region is recessed.

According to this structure, volumes of portions between the column banks in the gap end regions can be set such the volume of the first gap end region>the volume of the second gap end region, and in the forming of the light emitting layers, the volumes of inks including organic light emitting materials held in the first gap end region and the second gap end region can be increased.

According to at least one embodiment of the organic EL display panel, at least one region selected from the second gap end region and the first gap end region is a light-emitting-layer-present-region in which the dummy electrodes, which have a layer structure in common with the pixel electrodes, are not present and the light emitting layers can be in direct contact with a top surface of the substrate, and in plan view of the substrate, a total area of the light-emitting-layer-present-region in the second gap end region is larger than a total area of the light-emitting-layer-present-region in the first gap end region.

According to this structure, amounts of ink applied to the gap end regions can be set such that the amount applied to the first gap end region>the amount applied to the second gap end region. Thus, when forming the light emitting layers, volumes of inks containing light emitting materials held in the first gap end region and the second gap end region can be set such that the volume held in the first gap end region is greater than the volume held in the second gap end region.

According to at least one embodiment of the organic EL display panel, the organic EL display panel further includes row banks disposed above the substrate at least between column direction edges of the individual electrodes, the row banks extending in the row direction and arranged side by side along the column direction, wherein a total number of the row banks in the second gap end region is greater than a total number of the row banks in the first gap end region.

According to this structure, amounts of ink applied to the gap end regions can be set such that the amount applied to the first gap end region>the amount applied to the second gap end region. Thus, when forming the light emitting layers, volumes of inks containing light emitting materials held in the first gap end region and the second gap end region can be set such that the volume held in the first gap end region is greater than the volume held in the second gap end region. As a result, equivalent drying times can be realized for the ink of the first organic light emitting layer and the ink of the second organic light emitting layer, and a comparable degree of film thickness increase near the column direction ends of the region 10e can be achieved between the light emitting layers 123.

According to at least one embodiment of the organic EL display panel, the first organic light emitting layer and the second organic light emitting layer at the same position in the column direction are included in the same pixel.

According to at least one embodiment of the organic EL display panel, the organic EL display panel further includes a third organic light emitting layer among the organic light emitting layers disposed in a third gap selected from the gaps, the third gap being adjacent to the second gap in the row direction with one of the column banks therebetween and different from the first gap, wherein an average film thickness of the second organic light emitting layer in the display region is greater than an average film thickness of the third light emitting layer in the display region, and in plan view of the substrate, the second organic light emitting layer in the second gap end region has a volume greater than a volume of the third organic light emitting layer in a third gap end region extending in the column direction from a column direction end of the third gap to the reference position. According to at least one embodiment of the organic EL display panel, a wavelength of light emitted by the second organic light emitting layer is longer than a wavelength of light emitted by the third organic light emitting layer. According to at least one embodiment of the organic EL display panel, the first organic light emitting layer, the second organic light emitting layer, and the third organic light emitting layer at the same position in the column direction are included in the same pixel.

According to this structure, in a panel structure in which functional layers elongated in the column direction are arranged side by side, a difference of magnitude of film thickness variation near the column direction ends of the display element region 10e between different colors (RGB) of the organic light emitting layers 123 can be reduced. As a result, a difference between RGB colors in terms of luminance unevenness near column direction ends of the display element region 10e is reduced, and unevenness in light emission properties near the column direction ends can be suppressed.

Further, a method of manufacturing an organic EL display panel pertaining to at least one embodiment of the present disclosure is a method of manufacturing an organic EL display panel in which pixels are arranged in a matrix of rows and columns. The method includes preparing a substrate, forming individual electrodes above the substrate arranged in the matrix, forming column banks, applying inks, forming organic light emitting layers, and forming a counter electrode layer. The column banks are formed above the substrate at least between row direction edges of the individual electrodes, extending in the column direction and arranged side by side along the row direction. The inks are applied into gaps between the column banks including a first gap and a second gap, such that a first ink including a first organic light emitting material is applied to an entire length of the first gap between column direction ends of the column banks and a second ink including a second organic light emitting material is applied to an entire length of the second gap between column direction ends of the column banks. The second gap is adjacent to the first gap in the row direction with one of the column banks therebetween and the second organic light emitting material is different from the first organic light emitting material. The organic light emitting layers include a first organic light emitting layer formed by drying the first ink and a second organic light emitting layer formed by drying the second ink. The counter electrode layer is formed above the organic light emitting layers. The individual electrodes consist of pixel electrodes and dummy electrodes, and in the forming of the individual electrodes, the pixel electrodes are disposed in a display region centrally located in plan view of the substrate and the dummy electrodes are disposed in a peripheral region surrounding the display region. In the forming of the organic light emitting layers, in plan view of the substrate, the first organic light emitting layer in a first gap end region extending in the column direction from a column direction end of the first gap to a reference position a defined distance from the column direction end of the first gap towards the display region and within the peripheral region is made to have a volume greater than a volume of the second organic light emitting layer in a second gap end region extending in the column direction from a column direction end of the second gap to the reference position.

According to at least one embodiment of the method, in the forming of the organic light emitting layers, average film thickness of the first organic light emitting layer in the display region is made to be greater than average film thickness of the second organic light emitting layer in the display region.

According to this method, when using a wet process of applying and drying ink on a substrate to form functional layers to form a panel structure in which functional layers elongated in the column direction are arranged side by side, the display panel 10 can be manufactured in which a difference of magnitude of film thickness variation of the organic light emitting layers 123 near the column direction ends of the display element region 10e between the first organic light emitting layer and the second organic light emitting layer is reduced.

According to at least one embodiment of the method, in the applying of the first ink and the second ink, concentration of the first ink is higher than concentration of the second ink.

According to at least one embodiment of the method, a wavelength of light emitted by the first organic light emitting layer is made to be longer than a wavelength of light emitted by the second organic light emitting layer.

According to at least one embodiment of the method, in the forming of the column banks, length in the column direction of the first gap end region is made to be greater than length in the column direction of the second gap end region.

According to at least one embodiment of the method, in the forming of the column banks, in plan view of the substrate, at least one region selected from the first gap end region and the second gap end region is made to bend in the row direction.

According to at least one embodiment of the method, in the preparing of the substrate, a volume defined by the top surface of the substrate in the first gap end region and adjacent column banks among the column banks is made to be greater than a volume defined by the top surface of the substrate in the second gap end region and adjacent column banks among the column banks.

According to at least one embodiment of the method, in the forming of the individual electrodes, at least one region selected from the second gap end region and the first gap end region is a light-emitting-layer-present-region in which the dummy electrodes, which have a layer structure in common with the pixel electrodes, are not present and the light emitting layers can be in direct contact with a top surface of the substrate, and in plan view of the substrate, a total area of the light-emitting-layer-present-region in the second gap end region is made to be larger than a total area of the light-emitting-layer-present-region in the first gap end region.

According to at least one embodiment of the method, after the forming of the individual electrodes, the method further includes forming row banks above the substrate at least between column direction edges of the individual electrodes, the row banks extending in the row direction and arranged side by side along the column direction, wherein a total number of the row banks in the second gap end region is made to be greater than a total number of the row banks in the first gap end region.

According to at least one embodiment of the method, a ratio of the volume of the first organic light emitting layer in the first gap end region to average film thickness in the display region of the first organic light emitting layer is made to be greater than a ratio of the volume of the second organic light emitting layer in the second gap end region to average film thickness in the display region of the second organic light emitting layer.

According to at least one embodiment of the method, the first organic light emitting layer and the second organic light emitting layer at the same position in the column direction are included in the same pixel.

According to at least one embodiment of the method, the method further includes applying a third ink including a third organic light emitting material to an entire length of a third gap selected from the gaps between column direction ends of the column banks, the third gap being adjacent to the second gap in the row direction with one of the column banks therebetween and different from the first gap, the third organic light emitting material being different from the first organic light emitting material and different from the second organic light emitting material, wherein the forming of the organic light emitting layers includes forming a third organic light emitting layer by drying the third ink, an average film thickness of the second organic light emitting layer in the display region is made to be greater than an average film thickness of the third light emitting layer in the display region, and in plan view of the substrate, the second organic light emitting layer in the second gap end region is made to have a volume greater than a volume of the third organic light emitting layer in a third gap end region extending in the column direction from a column direction end of the third gap to the reference position.

According to at least one embodiment of the method, in the applying of the second ink and the third ink, concentration of the second ink is higher than concentration of the third ink.

According to at least one embodiment, a wavelength of light emitted by the second organic light emitting layer is made to be longer than a wavelength of light emitted by the third organic light emitting layer.

According to at least one embodiment, the first organic light emitting layer, the second organic light emitting layer, and the third organic light emitting layer at the same position in the column direction are included in the same pixel.

According to these configurations, when manufacturing a panel structure in which functional layers elongated in the column direction are arranged side by side, the display panel 10 can be manufactured in which a difference of magnitude of film thickness variation near the column direction ends of the display element region 10e between different colors (RGB) of the organic light emitting layers 123 is reduced, and the display panel 10 can be provided that reduces a difference between RGB colors in terms of luminance unevenness near column direction ends of the display element region 10e and suppresses unevenness in light emission properties near the column direction ends.

Embodiment 1

1. Circuit Structure of Display Device 1

The following is a description of a circuit structure of an organic electroluminescence (EL) display device 1 pertaining to Embodiment 1 (hereinafter also referred to as "display device 1"), provided with reference to FIG. 1.

As illustrated in FIG. 1, the display device 1 includes an organic EL display panel 10 (hereinafter also referred to as "display panel 10") and drive control circuitry 20 connected to the display panel 10.

The display panel 10 is an organic EL panel that makes use of electroluminescence of an organic material, in which organic EL elements are, for example, arranged in a matrix. The drive control circuitry 20 includes four drive circuits 21, 22, 23, 24 and a control circuit 25.

2. Circuit Structure of Display Panel 10

In the display panel 10, unit pixels 100e are arranged in a matrix, forming a display region. Each of the unit pixels 100e includes three organic EL elements, or in other words three subpixels 100se, emitting red (R), green (G), and blue (B) light respectively. Circuit structure of each of the subpixels 100se is described with reference to FIG. 2.

Figure 2:
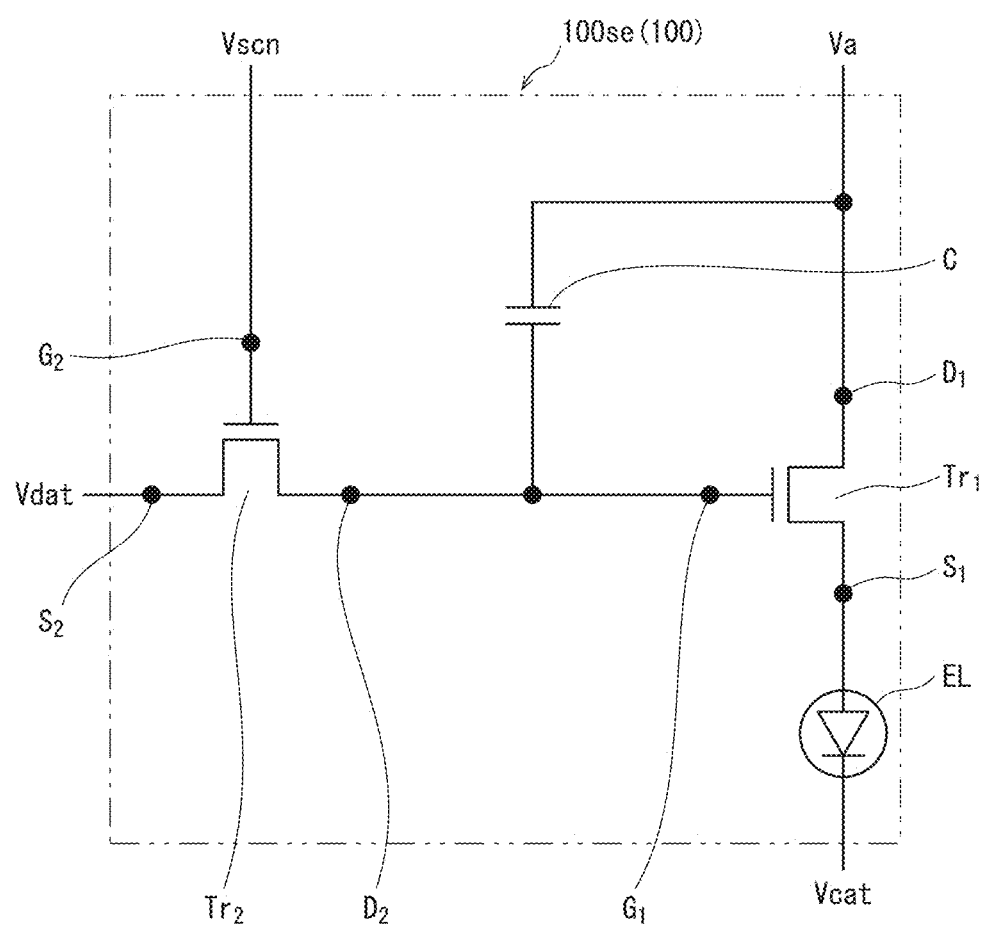
FIG. 2 is a schematic circuit diagram illustrating a circuit structure of a subpixel 100se of an organic EL display panel 10 in the organic EL display device 1 according to at least one embodiment.

FIG. 2 is a schematic circuit diagram illustrating circuit structure in an organic EL element 100 corresponding to the subpixels 100se of the display panel 10 used in the display device 1 according to at least one embodiment.

As illustrated in FIG. 2, in the display panel 10 pertaining to the present embodiment, each of the subpixels 100se includes two transistors $Tr_1$, $Tr_2$, one capacitor C, and an organic EL element portion EL as a light emitter. The transistor $Tr_1$ is a drive transistor and the transistor $Tr_2$ is a switching transistor.

A gate $G_2$ of the switching transistor $Tr_2$ is connected to a scan line Vscn, and a source $S_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power source line Va, and a source $S_1$ is connected to a pixel electrode (anode) of the organic EL element portion EL. A common electrode layer (cathode) of the organic EL element portion EL is connected to a ground line Vcat.

A first end of the capacitor C is connected to the drain $D_2$ of the switching transistor $Tr_2$ and the gate $G_1$ of the drive transistor $Tr_1$, and a second end of the capacitor C is connected to the power source line Va.

In the display panel 10, a plurality of adjacent subpixels 100se (for example, three subpixels 100se that emit red (R), green (G), and blue (B) light) constitute a single unit pixel 100e, and the unit pixels 100e are distributed and arranged to constitute a pixel region. For each of the subpixels 100se, a gate line leads out from the gate $G_2$ and is connected to a scan line Vscn connected from outside the display panel 10. Similarly, for each of the subpixels 100se, a source line leads out from the source $S_2$ and is connected to a data line Vdat connected from outside the display panel 10.

Further, power source lines Va and ground lines Vcat of subpixels 100se are aggregated and connected to a power source line and a ground line of the display device 1.

3. Overall Structure of Display Panel 10
3.1. Overview

The display panel 10 pertaining to the present embodiment is described with reference to the drawings. Note that the drawings are schematic diagrams and are not necessarily to scale.

Figure 3:
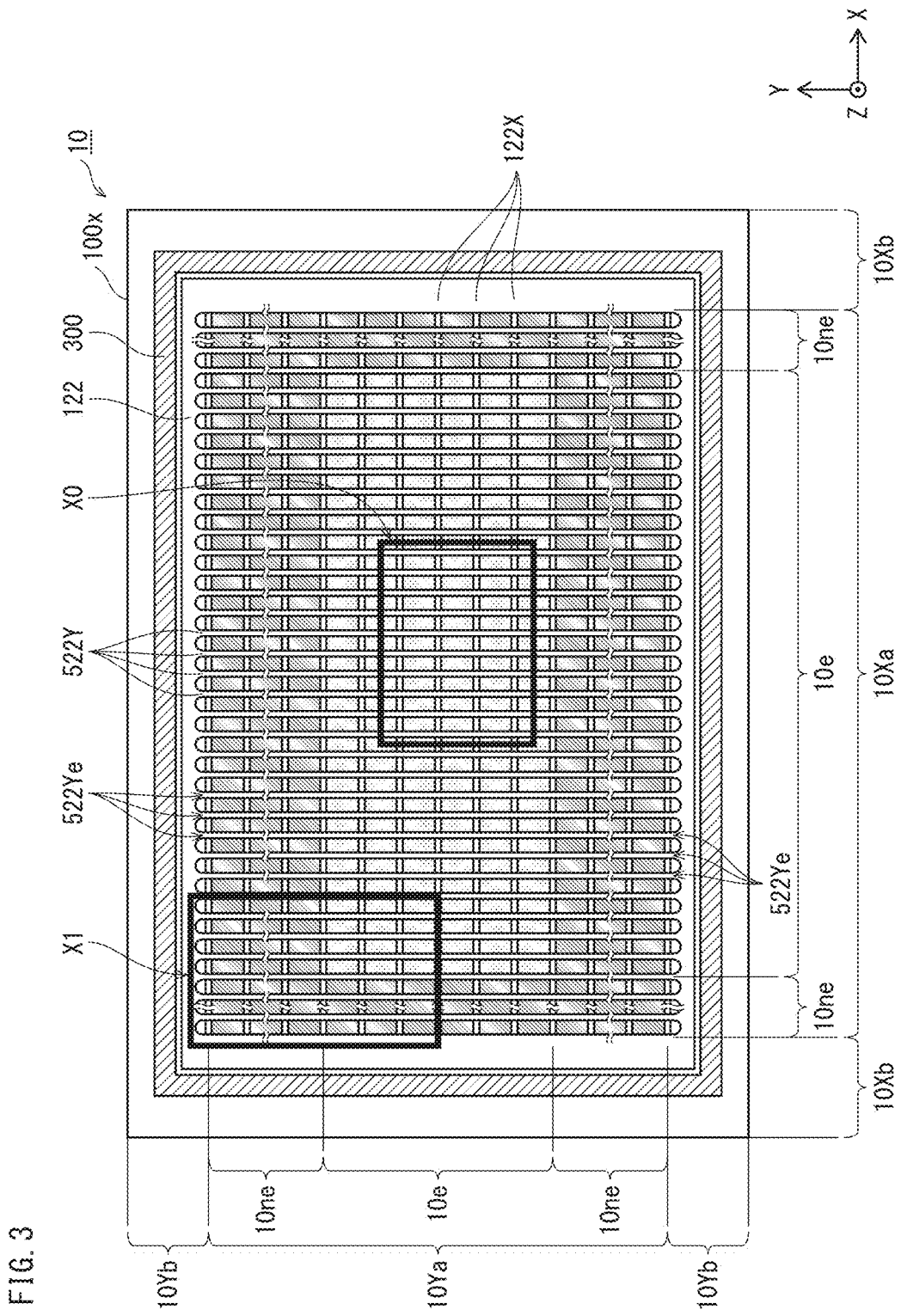
FIG. 3 is a schematic plan diagram illustrating the organic EL display panel 10 according to at least one embodiment.

FIG. 3 is a schematic plan view diagram of the display panel 10 according to at least one embodiment.

The display panel 10 is an organic EL display panel that makes use of electroluminescence of an organic compound. The display panel 10 has a top-emission structure in which light is emitted from a top surface thereof, and in which organic EL elements 100, which constitute pixels, are arranged in a matrix on a substrate 100x (TFT substrate) including thin film transistors (TFTs). Here, in the present description, the X direction, Y direction, and Z direction in FIG. 3 represent a row direction, column direction, and thickness direction of the display panel 10, respectively.

As illustrated in FIG. 3, the display panel 10 includes a partitioned region 10a (also referred to as a partitioned region 10Xa, 10Ya in terms of the X, Y directions) in which column banks 522Y and row banks 122X are arranged, defining light emission units of RGB colors in a matrix on the substrate 100x and a non-partitioned region 10b (also referred to as a non-partitioned region 10Xb, 10Yb in terms of the X, Y directions) surrounding the partitioned region 10a. In the present description, the column banks 522Y and the row banks 122X may also be referred to as an insulating layer 122. An outer peripheral edge in the column direction of the partitioned region 10a corresponds to column direction ends 522Ye of the column banks 522Y. In the non-partitioned region 10b, a sealing member 300 surrounds the insulating layer 122 including the partitioned region 10a. Further, the partitioned region 10a is composed of a region 10e including a substrate center and a region 10ne surrounding the region 10e. The region 10e is a region in which the organic EL elements 100 are formed in each partition defined by the column banks 522Y and the row banks 122X, while the region 10ne is a region in which the organic EL elements 100 are not formed in each partition. Further, length of the region 10ne in the X, Y directions is beneficially two or more times greater than length of any one of the subpixels 100se in the X, Y directions. According to the present embodiment, length of the region 10ne in the X, Y directions is four times that of length of any one of the subpixels 100se. Details of the region 10e and the region 10ne are described later.

3.2. Structure of Display Element Region (Display Region) 10e

Figure 4:
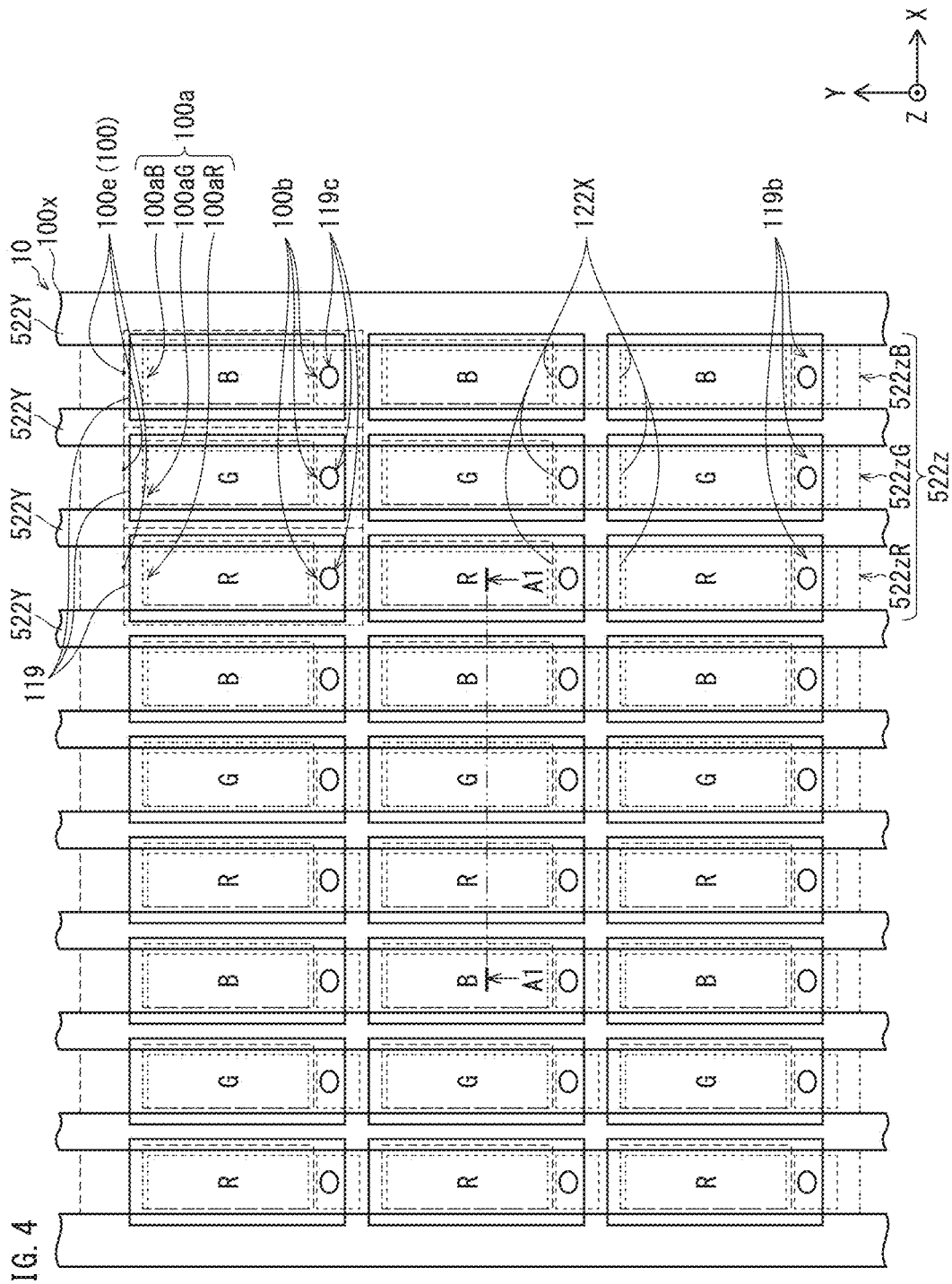
FIG. 4 is an enlarged plan diagram of a portion X0 of FIG. 3.
Figure 5:
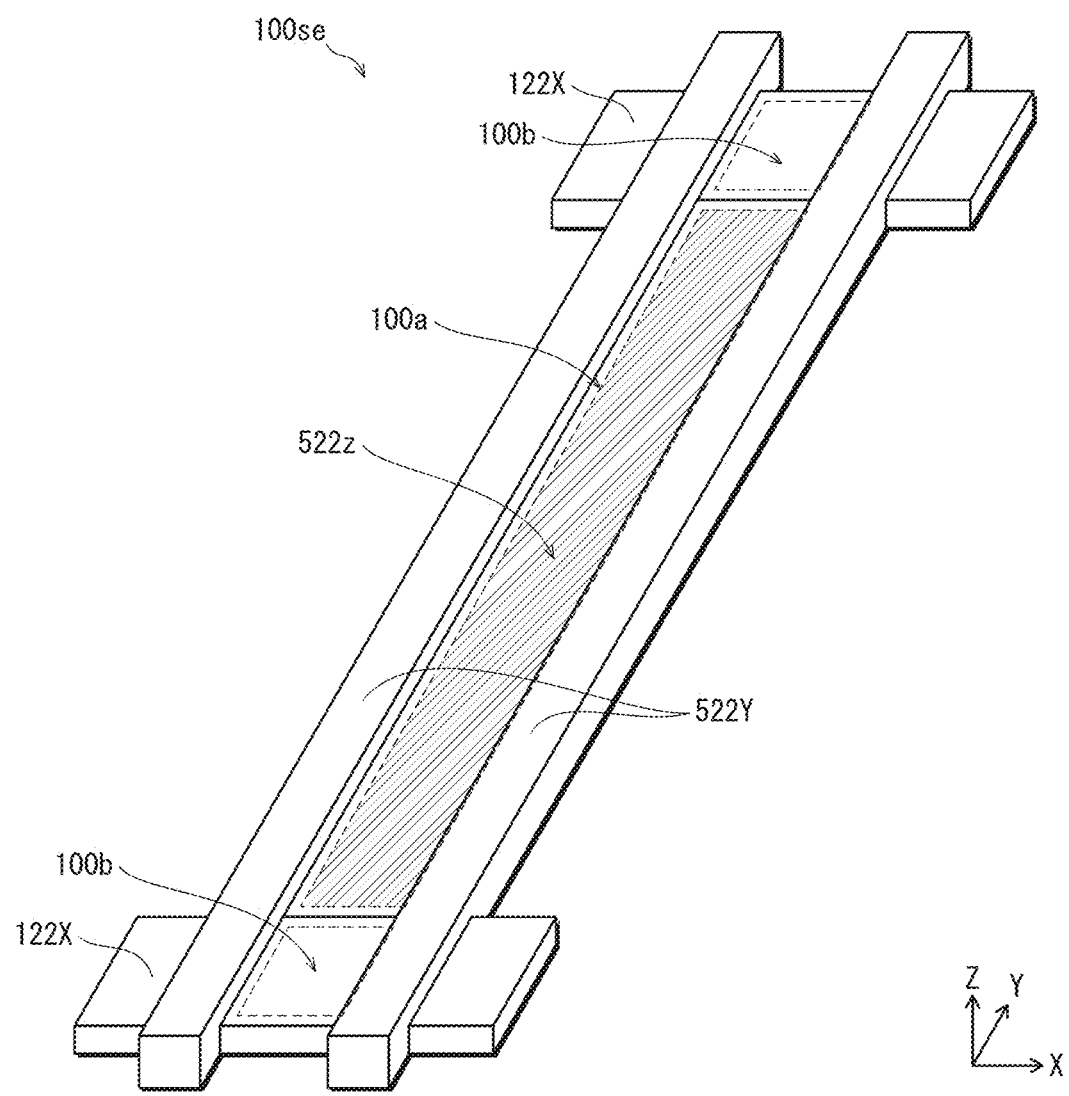
FIG. 5 is a perspective view diagram of a portion of an insulating layer corresponding to the subpixel 100se of an organic EL element 100 according to at least one embodiment.

FIG. 4 is an enlarged plan view diagram of a portion X0 of FIG. 3. FIG. 5 is a perspective view diagram of a portion of the insulating layer 122 corresponding to the subpixel 100se of an organic EL element 100 according to at least one embodiment.

Unit pixels 100e corresponding to the organic EL elements 100 are arranged in a matrix in the display element region 10e (also referred to as display region 10e or region 10e) of the display panel 10. In each of the unit pixels 100e are a red-self-light-emission region 100aR, a green-self-light-emission region 100aG, and a blue-self-light-emission region 100aB (also referred to as self-light-emission regions 100a), the three self-light-emission regions 100a being regions that emit light due to an organic compound. That is, as illustrated in FIG. 4, three subpixels 100se corresponding to one each of the self-light-emission regions 100aR, 100aG, 100aB lined up in the row direction constitute one unit pixel 100e in a color display.

Further, as illustrated in FIG. 4, in the display panel 10, pixel electrodes 119 are arranged in a matrix on the substrate 100x, separated from each other by defined distances in the row and column directions. The pixel electrodes 119 are rectangular in plan view, and are made of a light-reflective material. The pixel electrodes 119 arranged in the matrix correspond to the self-light-emission regions 100aR, 100aG, 100aB.

In the display panel 10, the insulating layer 122 has a line-like insulating layer form, and in regions above row direction ends of the pixel electrodes 119 adjacent to each other and above the substrate 100x between the row direction ends of the pixel electrodes 119, the column banks 522Y extend in the column direction (Y direction in FIG. 3) and are arranged side-by-side along the row direction. Thus, row direction edges of the self-light-emission regions 100a are defined by row direction edges of the column banks 522Y.

On the other hand, in regions above column direction ends of the pixel electrodes 119 adjacent to each other and above the substrate 100x between the column direction ends of the pixel electrodes 119, the row banks 122X extend in the row direction (X direction in FIG. 3) and are arranged side-by-side along the column direction. Regions in which the row banks 122X are present are non-self-light-emission regions 100b in which organic electroluminescence does not occur in the light emitting layers 123 above the pixel electrodes 119. Thus, column direction edges of the self-light-emission regions 100a are defined by column direction edges of the row banks 122X.

When gaps 522z are defined between the column banks 522Y that are adjacent to each other, the gaps 522z include red gaps 522zR corresponding to the self-light-emission regions 100aR, green gaps 522zG corresponding to self-light-emission regions 100aG, and blue gaps 522zB corresponding to self-light-emission regions 100aB (red gaps 522zR, green gaps 522zG, and blue gaps 522zB are also referred to as "gaps 522z"). A large number of the column banks 522Y and the gaps 522z are arranged alternating across the display panel 10.

Further, as illustrated in FIG. 4, in the display panel 10, the self-light-emission regions 100a and the non-self-light-emission regions 100b are arranged alternating in the column direction along the gaps 522z. In the non-self-light-emission regions 100b are connection recesses 119c (contact holes) for connecting the pixel electrodes 119 to the sources $S_1$ of the TFTs, and contact regions 119b (contact windows) on the pixel electrodes 119 for electrical connection to the pixel electrodes 119.

As illustrated in FIG. 4 and FIG. 5, for one subpixel 100se, the column banks 522Y extending in the column direction and the row banks 122X extending in the row direction are orthogonal to each other, and the self-light-emission region 100a is between the row banks 122X in the column direction.

3.3. Structure of Non-Light-Emission Region (Peripheral Region) 10ne

Figure 6:
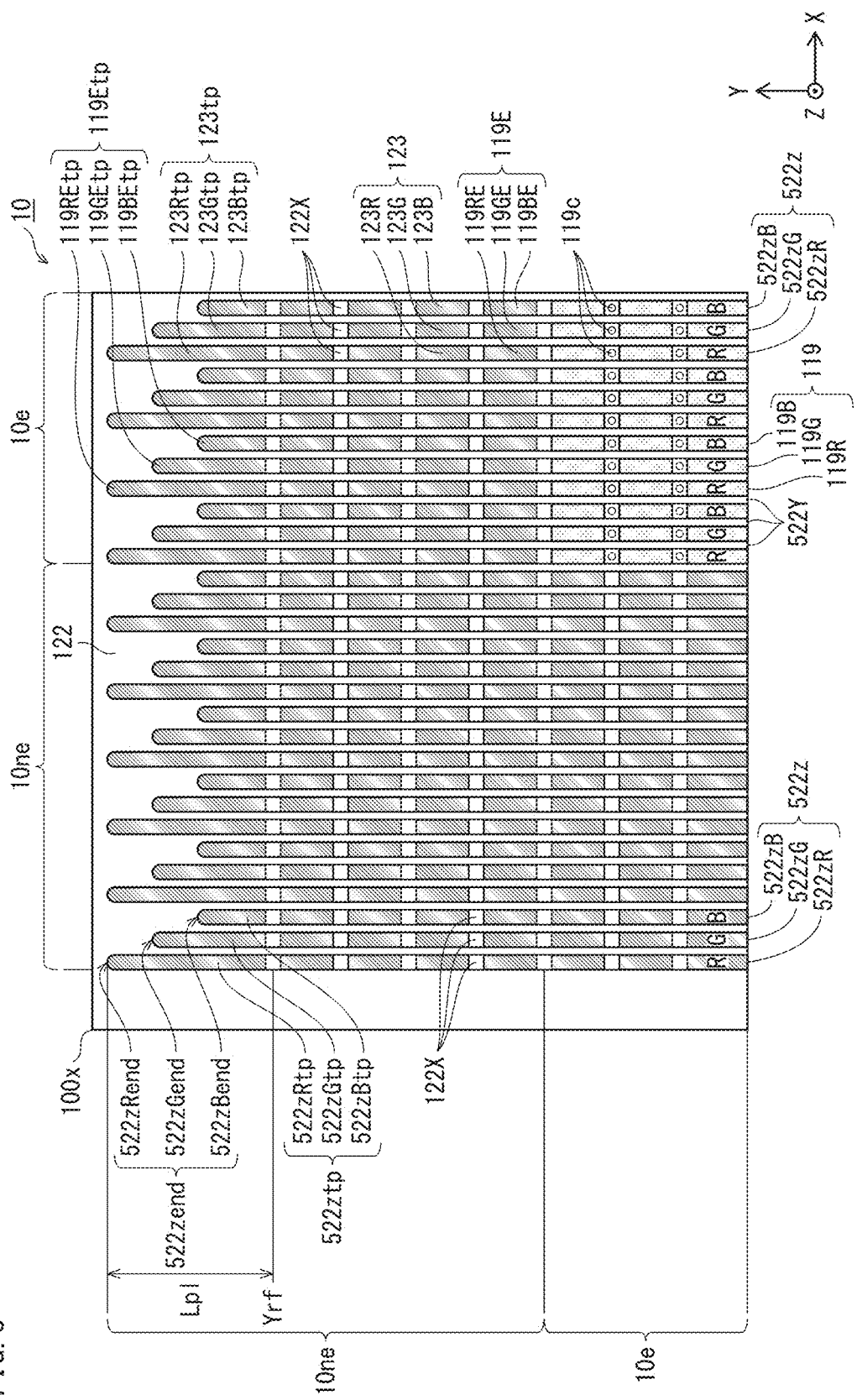
FIG. 6 is an enlarged plan diagram of a portion X1 of FIG. 3.

FIG. 6 is an enlarged plan view diagram of a portion X1 of FIG. 3. In the display panel 10, as described above, the non-light-emission region 10ne (also referred to as peripheral region 10ne or region 10ne), in which the organic EL elements 100 are not formed in each partition, is formed on the substrate 100x for a defined number of partitions from an edge of the partitioned region 10a. According to the present embodiment, dummy electrodes 119E are provided for each partition on the substrate in the region 10ne. The dummy electrodes 119E are functionally different from the pixel electrodes 119 in that no contact holes are formed in the planarizing layers 118, the sources $S_1$ of the drive transistors $Tr_1$ are not connected, and the dummy electrodes 119E are not driven by the transistors. The surfaces of the dummy electrodes 119E may be the same as the surfaces of the pixel electrodes 119. It is not necessary for current to flow from the drive transistors $Tr_1$ for the dummy electrodes 119E, and therefore in addition to lacking contact holes, the dummy electrodes 119E may be formed such that the drive transistors $Tr_1$ are not connected to lower wiring, or the drive transistors $Tr_1$ are not formed for dummy pixels including the dummy electrodes 119E, or the like.

In the region 10ne, in the gaps 522z between adjacent ones of the column banks 522Y, red gaps 522zR are those in which organic light emitting layers 123R are present and made of the same organic light emitting material as those of the self-light-emission regions 100aR, green gaps 522zG are those in which organic light emitting layers 123G are present and made of the same organic light emitting material as those of the self-light-emission regions 100aG and blue gaps 522zB are those in which organic light emitting layers 123B are present and made of the same organic light emitting material as those of the self-light-emission regions 100aB.

As illustrated in FIG. 6, in the display panel 10, in the region 10ne surrounding the region 10e, the red gaps 522zR, the green gaps 522zG, and the blue gaps 522zB are arranged to repeat in this order in the row direction, as in the region 10e. Column direction ends 522zend of the gaps 522z in the region 10ne are configured such that positions in the column direction vary depending on light emission color of the light emitting layers 123 in the gaps 522z.

Specifically, column direction ends 522zRend of the red gaps 522zR are closer to a column direction edge of the substrate 100x than column direction ends 522zGend of the green gaps 522zG, and the column direction ends 552zGend of the green gaps 522zG are closer to the column direction edge of the substrate 100x than column direction ends 522zBend of the blue gaps 522zB.

Thus, when defining a reference position Yrf as a position in the region 10ne separated from the column direction ends 522zRend of the red gaps 522zR towards an interior of the substrate 100x in the column direction by a defined distance Lpl, a column direction length of a red gap end region 522zRtp (also referred to as a red end region 522zRtp) from the column direction ends 522zRend of the red gaps 522zR to the reference position Yrf is longer than a column direction length of a green gap end region 522zGtp (also referred to as a green end region 522zGtp) from the column direction ends 522zGend of the green gaps 522zG to the reference position Yrf, and the column direction length of the green end region 522zGtp is longer than a column direction length of a blue gap end region 522zBtp (also referred to as a blue end region 522zBtp) from the column direction ends 522zBend of the blue gaps 522zB to the reference position Yrf. Where the color of the gap end regions are not distinguished, they are also referred to as gap end regions 522ztp.

Further, as illustrated in FIG. 6, a dummy electrode 119REtp and a light emitting layer 123REtp are laminated in the red end region 522zRtp, a dummy electrode 119GEtp and a light emitting layer 123GEtp are laminated in the green end region 522zGtp, and a dummy electrode 119BEtp and a light emitting layer 123BEtp are laminated in the blue end region 522zBtp.

Thus, length in the column direction of the light emitting layer 123REtp in the red end region 522zRtp is greater than length in the column direction of the light emitting layer 123GEtp in the green end region 522zGtp, and as a result, volume of the light emitting layer 123REtp is greater than volume of the light emitting layer 123GEtp. Further, length in the column direction of the light emitting layer 123GEtp is greater than length in the column direction of the light emitting layer 123BEtp in the blue end region 522zBtp, and as a result, volume of the light emitting layer 123GEtp is greater than volume of the light emitting layer 123BEtp.

According to this structure, the display panel 10, when compared to a conventional structure can reduce the size of variation in film thicknesses between RGB colors of organic light emitting layers 123 near column direction ends of the region 10e, and can suppress unevenness in light emission properties near column direction ends of the region 10e. Further details are provided later.

4. Components of Display Panel 10

Figure 7:
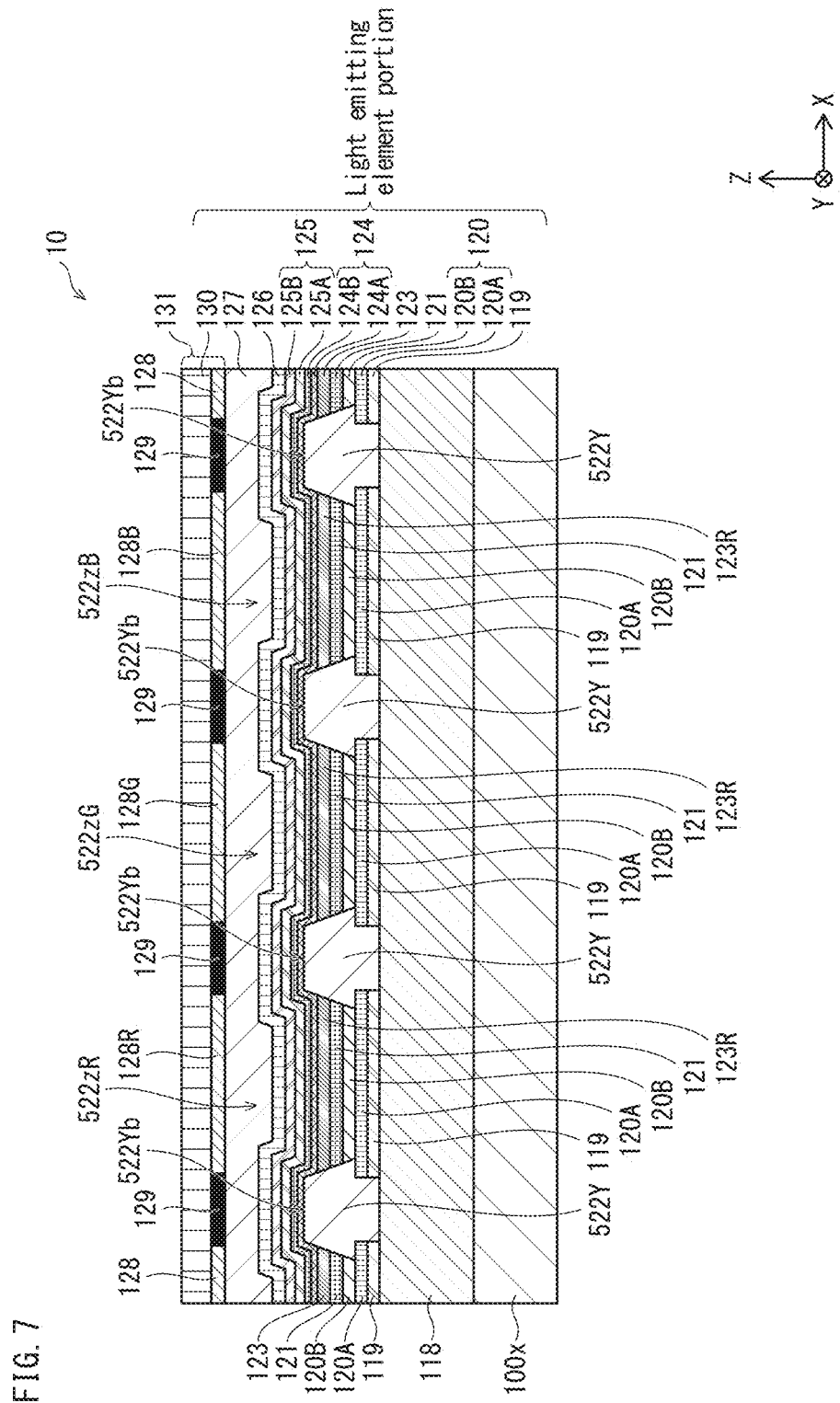
FIG. 7 is a schematic cross-section diagram of a cross-section taken along A1-A1 in FIG. 4.

Structure of the organic EL elements 100 in the display panel 10 is described with reference to FIG. 7. FIG. 7 is a schematic cross-section diagram of a cross-section taken along A1-A1 in FIG. 4.

In the display panel 10 according to the present embodiment, a substrate (TFT substrate) including thin film transistors is lowest in the Z axis direction, above which are organic EL element portions.

4.1. Components of Organic EL Elements 100

(1) Substrate 100x

The substrate 100x is a support member of the display panel 10 and includes a base (not illustrated) and a thin film transistor layer (not illustrated) on the base.

The base is a support member of the display panel 10, and is a flat plate. As a material of the base, an electrically insulating material such as a glass material, a resin material, a semiconductor material, or a metal material coated with an insulating layer can be used.

The TFT layer includes TFTs and wiring (connecting sources $S_1$ of the TFTs to corresponding pixel electrodes 119) formed on a top surface of the base. TFTs electrically connect corresponding pixel electrodes 119 to an external power source in response to a drive signal from an external circuit of the display panel 10, and have multilayer structures including an electrode, a semiconductor layer, an insulating layer, and the like. Wiring electrically connects the TFTs, the pixel electrodes 119, external power source, external circuitry, and the like.

(2) Planarizing Layer 118

A planarizing layer 118 is provided on a top surface of the base and TFT layer. The planarizing layer 118 on a top surface of the substrate 100x planarizes the top surface of the substrate 100x, which is irregular due to the TFT layer. Further, the planarizing layer 118 fills between wiring and TFTs, electrically insulating between the wiring and TFTs.

In order to connect the pixel electrodes 119 to wiring connected to the sources $S_1$ of corresponding pixels, the planarizing layer 118 is provided with contact holes (not illustrated) above the wiring.

4.2. Organic EL Element Portion (1) Pixel Electrodes 119

On the planarizing layer 118 in the region 10e of the substrate 100x, the pixel electrodes 119 are provided in one-to-one correspondence with the sub-pixels 100se, as illustrated in FIG. 6.

The pixel electrodes 119 supply carriers to the light emitting layers 123. For example, if functioning as anodes, the pixel electrodes 119 supply holes to the light emitting layers 123. Further, the display panel 10 is a top-emission type, and therefore the pixel electrodes 119 are light reflective. The pixel electrodes 119 have, for example, a flat substantially rectangular plate shape in plan view. In contact holes (not illustrated) of the planarizing layer 118 are formed connecting recesses (contact holes, not illustrated) of the pixel electrodes 119 that are portions of the pixel electrodes 119 recessed towards the substrate 100x, and at bottoms of the connecting recesses the pixel electrodes 119 are connected to wiring connected to sources $S_1$ of corresponding pixels.

(2) Dummy Electrodes 119E

On the planarizing layer 118 in the region 10ne of the substrate 100x, the dummy electrodes 119E are provided in one-to-one correspondence with partitions defined by the column banks 522Y and the row banks 122X, as illustrated in FIG. 6.

The dummy electrodes 119E have, for example, a flat substantially rectangular plate shape in plan view, as per the pixel electrodes 119. A point of difference from the pixel electrodes 119 is that no contact holes are formed in the planarizing layer 119 and the dummy electrodes 119E are not connected to the sources $S_1$ of corresponding pixels.

(3) Hole Injection Layers 120

As illustrated in FIG. 7, hole injection layers 120 are laminated on the pixel electrodes 119 and the dummy electrodes 119E. The hole injection layers 120 have a function of transporting holes injected from the pixel electrode layers 119 to hole transport layers 121.

Each of the hole injection layers 120 includes, in order from a side nearer the substrate 100x, a hole injection layer 120A made of a metal oxide and formed on the pixel electrode 119 or the dummy electrode 119E, and, in the gaps 522zR, 522zG, 522zB, a hole injection layer 120B made of an organic material and laminated on the hole injection layer 120A.

According to the present embodiment, the hole injection layers 120B each have a line-like shape extending in the column direction in the gaps 522zR, 522zG, 522zB. However, the hole injection layers 120B may be discontinuous in the column direction in the gaps 522z, i.e., provided only on the hole injection layers 120A on the pixel electrodes 119.

(4) Banks 122

As illustrated in FIG. 6, banks made of an insulating material are formed so as to cover edges of the pixel electrodes 119, the dummy electrodes 119E, and the hole injection layers 120. The banks include the column banks 522Y that extend in the column direction and are arranged side-by-side in the row direction and the row banks 122X that extend in the row direction and are arranged side-by-side in the column direction. As illustrated in FIG. 4, the column banks 522Y extend in the column direction orthogonal to the row banks 122X, the column banks 522Y and the row banks 122X forming a lattice shape (the row banks 122X and the column banks 522Y are also referred to as "banks 122").

The row banks 122X each have a line-like shape extending in the row direction, and in a cross-section taken parallel to the column direction the row banks 122X each have a tapered trapezoid shape that tapers upwards. The row banks 122X pass through the column banks 522Y and extend along the row direction orthogonal to the column direction. The row banks 122X have a top surface that is lower than a top surface 522Yb of the column banks 522Y. Thus, the row banks 122X and the column banks 522Y form openings corresponding to the self-light-emission regions 100a.

The row banks 122X are for controlling flow in the column direction of ink containing an organic compound that is a material of the light emitting layers 123. Thus, the row banks 122X have lyophilicity with respect to the ink of at least a defined value. Accordingly, the row banks 122X suppress variation in ink amount between subpixels. The pixel electrodes 119 are not exposed where the row banks 122X are present and regions where the row banks 122X are present do not emit light or contribute to luminance.

The row banks 122X are present above edges in the column direction of the pixel electrodes 119, and thereby help prevent electrical leaks between the pixel electrodes 119 and a common electrode layer 125 (also referred to as a counter electrode layer 125). Base portions in the column direction of the row banks 122X define edges of the self-light-emission regions 100a of the sub-pixels 100se in the column direction.

The column banks 522Y each have a line-like shape extending in the column direction, and in a cross-section taken parallel to the row direction the column banks 522Y each have a tapered trapezoid shape that tapers upwards. The column banks 522Y block flow of ink in the row direction, the ink including an organic compound that is a material of the light emitting layers 123. Thus, the column banks 522Y define the row direction edges of the light emitting layers 123.

The column banks 522Y are present above edges in the row direction of the pixel electrodes 119, and thereby help prevent electrical leaks between the pixel electrodes 119 and the common electrode layer 125. Base portions in the row direction of the column banks 522Y define edges of the self-light-emission regions 100a of the sub-pixels 100se in the row direction.

The column banks 522Y have liquid repellency with respect to the ink of at least a defined value.

(5) Hole Transport Layers 121

As illustrated in FIG. 7, the hole transport layers 121 are laminated on the hole injection layers 120 in the gaps 522zR, 522zG, 522zB. Further, the hole transport layers 121 are also laminated on the hole injection layers 120 on the row banks 122X (not illustrated). The hole transport layers 121 are in contact with the hole injection layers 120B. The hole transport layers 121 have a function of transporting holes injected from the hole injection layers 120 to the light emitting layers 123.

According to the present embodiment, a structure is adopted in which the hole transport layers 121 each have a line-like shape extending in the column direction in the gaps 522z, similar to the hole injection layers 120B.

(6) Light Emitting Layers 123

As illustrated in FIG. 7, the light emitting layers 123 are layered on the hole transport layers 121. The light emitting layers 123 are layers made of an organic compound, and have a function of emitting light through recombination of holes and electrons that occurs in the light emitting layers 123. In the gaps 522zR, 522zG, 522zB defined by the column banks 522Y, the light emitting layers 123 each have a line-like shape extending in the column direction. In the red gaps 522zR corresponding to the self-light-emission regions 100aR in the red sub-pixels 100seR, the green gaps 522G corresponding to the self-light-emission regions 100aG in the green sub-pixels 100seG, and the blue gaps 522zB corresponding to the self-light-emission regions 100aB in the blue sub-pixels 100seB are light emitting layers 123R, 123G, 123B, respectively, that emit light of corresponding colors (also referred to as the light emitting layers 123).

In the subpixels 100se of each color, the light emitting layers 123 are present between the pixel electrodes 119 and the counter electrode layer 125, and an optical resonator structure is formed causing optical resonance of light from the light emitting layers 123 and emitting the light from the counter electrode layer 125 side of the optical resonator structure. Light generated in the light emitting layers 123 is emitted externally from the counter electrode layer 125, but the light includes both "direct light" directly emitted from the light emitting layers 123 towards the counter electrode layer 125 and "reflected light" emitted from the light emitting layers 123 towards the pixel electrodes 119 and reflected at the pixel electrodes 119 towards the counter electrode layer 125.

In the optical resonator structure of the display panel 10 are two light paths, a first light path along which a portion of light emitted from a given one of the light emitting layers 123 is transmitted towards the counter electrode layer 125 without being transmitted towards the pixel electrodes 119, transmitted through the counter electrode layer 125, and emitted outside the organic light emitting element (direct light), and a second light path along which a remaining portion of light emitted from the given one of the light emitting layers 123 is transmitted towards the pixel electrodes 119, reflected at the pixel electrodes 119, transmitted through the given one of the light emitting layers 123 and the counter electrode layer 125, and emitted outside the organic light emitting element (reflected light).

Optical distances between a top surface of the light emitting layers and a top surface of the pixel electrodes are set so that light components corresponding to each color are intensified by constructive interference between the direct light and the reflected light. More specifically, thickness of the light emitting layers 123R is larger than thickness of the light emitting layers 123G, and thickness of the light emitting layers 123G is larger than thickness of the light emitting layers 123B. Here, thicknesses of the light emitting layers 123R, 123G, 123B in the subpixels 100se are defined by average film thickness in the region 10e, in which each color of the subpixels 100se are present. For example, the thickness of the light emitting layers 123R is from 70 nm to 150 nm, the thickness of the light emitting layers 123G is from 40 nm to 100 nm, and the thickness of the light emitting layers 123B is less than 60 nm, such that the optical distances from the top surfaces of the light emitting layers 123 to the top surfaces of the pixel electrodes 119 become larger in an order from the blue subpixels 100seB, to the green subpixels 100seG, to the red subpixels 100seB.

Thus, in the red subpixels 100seR, the green subpixels 100seG, and the blue subpixels 100seB, the optical resonator structure is formed so that light components corresponding to each color are intensified, by setting optical distances between the top surfaces of the light emitting layers 123 and the top surface of the pixel electrodes according to wavelengths of light emitted from the light emitting layers 123R, 123G, 123B.

Only portions of the light emitting layers 123 that are supplied carriers from the pixel electrodes 119 emit light, and therefore in regions in which the row banks 122X, which are insulators, are present between layers, organic compound electroluminescence does not occur. Thus, only portions of the light emitting layers 123 where the row banks 122X are not present emit light, such portions are the self-light-emission regions 100a, and edges of the self-light-emission regions 100a in the column direction are defined by column-direction edges of the row banks 122X.

Portions of the light emitting layers 123 above side surfaces and top surfaces of the row banks 122X do not emit light, and such portions are the non-self-light-emission regions 100b. In the self-light-emission regions 100a, the light emitting layers 123 are disposed on top surfaces of the hole transport layers 121, and in the non-self-light-emission regions 100b, the light emitting layers 123 are disposed on top surfaces of the hole transport layers 121 on top and side surfaces of the row banks 122X (not illustrated).

The light emitting layers 123 extend continuously not only in the self-light-emission regions 100a but also across the non-self-light-emission regions 100b that are adjacent in the column direction. In this way, when forming the light emitting layers 123, ink applied to the self-light-emission regions 100a can flow in the column direction via ink applied to the non-self-light-emission regions 100b, making equalizing of film thickness between pixels in the column direction possible. However, in the non-self-light-emission regions 100b, ink flow is suppressed to an appropriate extent by the row banks 122X. Accordingly, large amounts of unevenness in film thickness in the column direction are unlikely to occur, and luminance evenness between pixels is improved.

(7) Electron Transport Layer 124

As illustrated in FIG. 4 and FIG. 7, the electron transport layer 124 is laminated covering the column banks 522Y and the gaps 522z defined by the column banks 522Y. The electron transport layer 124 is continuous across at least the entire display area of the organic EL display panel 10. The electron transport layer 124 includes, in order from the substrate 100x, an electron transport layer 124A made of a metal oxide, fluoride, or the like, and an electron transport layer 124B that is primarily an organic substance laminated on the electron transport layer 124A (the electron transport layer 124A and the electron transport layer 124B are also referred to together as "the electron transport layer 124").

As illustrated in FIG. 7, the electron transport layer 124 is formed on the light emitting layers 123. The electron transport layer 124 has a function of transporting electrons from the common electrode layer 125 to the light emitting layers 123 and a function of restricting injection of electrons into the light emitting layers 123.

(8) Common Electrode Layer 125 (Counter Electrode Layer)

As illustrated in FIG. 7, the common electrode layer 125 is formed on the electron transport layer 124. The common electrode layer 125 is an electrode common to the light emitting layers 123. The common electrode layer 125 includes, in this order from the substrate 100x, a common electrode layer 125A made of a metal oxide and a common electrode layer 125B that is primarily metal layered on the common electrode layer 125A (the common electrode layer 125A and the common electrode layer 125B are also referred to together as "the common electrode layer 125").

As illustrated in FIG. 7, the common electrode layer 125 is also in a region above the pixel electrodes 119 on the electron transport layer 124. The common electrode layer 125 forms a conduction path paired with the pixel electrodes 119, sandwiching the light emitting layers 123. The common electrode layer 125 supplies carriers to the light emitting layers 123. For example, in the case of the common electrode layer 125 functioning as a cathode, it supplies electrons to the light emitting layers 123.

As illustrated in FIG. 7, the common electrode layer 125B is formed on a top surface of the common electrode layer 125A.

(9) Sealing Layer 126

The sealing layer 126 covers the common electrode layer 125. The sealing layer 126 is for suppressing deterioration of the light emitting layers 123 caused by contact with moisture, air, and the like. The sealing layer 126 is formed to cover the top surface of the common electrode layer 125.

(10) Joining Layer 127

Above the sealing layer 126 in the Z axis direction is a color filter substrate 131 including an upper substrate 130 and a color filter layer 128 disposed below the upper substrate 130 in the Z axis direction. The color filter substrate 131 is joined to the sealing layer 126 by a joining layer 127. The joining layer 127 has a function of joining the color filter substrate 131 to a "back panel" consisting of each layer from the substrate 100x to the sealing layer 126, and has a function of preventing each layer from being exposed to moisture and air.

4.3. Components of Color Filter Substrate (1) Upper Substrate 130

The color filter substrate 131, which includes the upper substrate 130 and the color filter layer 128, is disposed on and joined to the joining layer 127. The display panel 10 is a top-emission type of panel and therefore, for example, a light-transmissive material such as cover glass, light-transmissive resin film, or the like is used for the upper substrate 130. Further, the upper substrate 130 can improve rigidity of the display panel 10, and help prevent intrusion of moisture, air, and the like.

(2) Color Filter Layer 128

The color filter layer 128 is formed on the upper substrate 130 at positions corresponding to each of the self-light-emission regions 100a of pixels. The color filter layer 128 is a light-transmissive layer provided for allowing transmission of visible light of wavelengths corresponding to R, G, and B and has a function of transmitting light emitted from each color pixel and correcting chromaticity of the transmitted light. For example, according to the present embodiment, red, green, and blue color filter layers 128R, 128G, and 128B are formed above self-light-emission regions 100aR in the red gaps 522zR, the self-light-emission regions 100aG in the green gaps 522zG, and the self-light-emission regions 100aB in the blue gaps 522zB, respectively.

(3) Light Shielding Layer 129

The light shielding layer 129 is formed on the upper substrate 130 in positions corresponding to boundaries between self-light-emission regions 100a of pixels. The light shielding layer 129 is a black resin layer provided to prevent transmission of visible light of wavelengths corresponding to R, G, and B. For example, the light shielding layer is made of a resin material including black pigment with excellent light absorption and light shielding properties.

4.4. Component Materials

Examples of materials included in layers illustrated in FIG. 4 and FIG. 7 are provided below.

(1) Substrate 100x (TFT Substrate)

For the base, for example, a glass substrate, a silica glass substrate, a silicon substrate, a metal substrate of a metal such as molybdenum sulfide, copper, zinc, aluminum, stainless steel, magnesium, iron, nickel, gold, or silver, a semiconductor substrate such as gallium arsenide, a plastic substrate, or the like can be used.

The TFT layer includes TFT circuits formed on the base 100p, an inorganic insulating layer (not illustrated) formed on the TFT circuits, and the planarizing layer 118. The TFT circuits consist of a plurality of TFTs and wiring formed on a top layer of the base. Each TFT electrically connects a corresponding one of the pixel electrodes 119 to an external power source in accordance with a drive signal from an external circuit of the organic EL element 100, and is a multilayer structure including layers such as an electrode, a semiconductor layer, and an insulating layer. The wiring electrically connects the TFTs, the pixel electrodes 119, the external power source, external circuits, and the like.

Publicly known materials can be used for TFT elements such as gate electrodes, gate insulating layers, channel layers, channel protection layers, source electrodes, drain electrodes, and the like.

As a material of the planarizing layer 118 on a top surface of the substrate 100x, an organic compound such as polyimide resin, acrylic resin, siloxane resin, novalac-type phenolic resin, or the like can be used.

(2) Pixel Electrodes 119 and Dummy Electrodes 119E

The pixel electrodes 119 are made of a metal material. In the case of the organic EL display panel 10 pertaining to the present embodiment, which is a top-emission type, chromaticity of emitted light is adjusted and luminance increased by adoption of an optical resonator structure for which thickness is optimized, and therefore a surface portion of the pixel electrodes 119 has a high reflectivity. The pixel electrodes 119 in the organic EL display panel 10 pertaining to the present embodiment may have a structure in which a plurality of films selected from a metal layer, an alloy layer, and a light-transmissive conductive layer are layered. The metal layer can be made from a metal material including, for example, silver (Ag) or aluminum (Al) as a material that has low sheet resistance and high light reflectivity. For example, an aluminum (Al) alloy has a high light reflectivity from 80% to 95% and a low electrical resistivity of $2.82 \times 10^{-8}$ (10 n$\Omega$·m), and is therefore an appropriate material of the pixel electrodes 119.

Aside from an aluminum alloy metal layer, in terms of high reflectivity, silver, a silver alloy, or the like can he used.

As a material of the light-transmissive conductive layer, indium tin oxide (ITO), indium zinc oxide (IZO), or the like can be used. Further, in terms of cost, it is beneficial to use a metal layer or an alloy layer that is primarily aluminum.

The dummy electrodes 119E are made of the same material as the pixel electrodes 119.

(3) Hole Injection Layers 120

The hole injection layers 120A are layers made of an oxide such as silver (Ag), molybdenum (Mo), chromium (Cr), vanadium (V), tungsten (W), nickel (Ni), iridium (Ir), or the like. When the hole injection layers 120A include a transition metal oxide, multiple valences and multiple energy levels can be taken. As a result, hole injection is facilitated, and a reduction in drive voltage becomes possible.

The hole injection layers 120B, as described above, can be formed by using, for example, an applied film made from an organic polymer solution of an electrically-conductive polymer material such as poly(3,4-ethylenedioxythiophene) polystyrene sulfonate (PEDOT:PSS).

(4) Banks 122

The banks 122 are formed by using an organic material such as a resin, and are insulative. As examples of the organic material used to form the banks 122, acrylic resin, polyimide resin, novolac-type phenolic resin, or the like may be used. The banks 122 beneficially have an organic solvent resistance. More beneficially, acrylic resin is used, because acrylic resin has a low refractive index and is appropriate as a reflector.

Alternatively, when an inorganic material is used for the banks 122, use of silicon oxide (SiO), for example, is beneficial in terms of having an appropriate refractive index. Alternatively, for example, an inorganic material such as silicon nitride (SiN), silicon oxynitride (SiON), or the like can be used.

Further, as the banks 122 may be treated with etching, baking, and the like during a manufacturing process, the banks 122 are beneficially formed by using a highly resistant material that does not excessively deform or change due to such treatments.

In order to make surfaces of the banks 122 liquid-repellant, the surfaces can be treated with fluorine. Further, the banks 122 may be formed by using a material that includes fluorine. Further, in order to lower liquid repellency of surfaces of the banks 122, ultraviolet irradiation of the banks 122 and/or low temperature baking of the banks 122 may be performed.

(5) Hole Transport Layers 121

For the hole transport layers 121, for example, a polyfluorene or a derivative thereof, a polymer compound such as a polyarylamine, which is an amine organic polymer, or a derivative thereof, poly(9,9-di-n-octylfluorene-alt-(1,4-phenylene-((4-sec-butylphenyl)imino)-1,4-phenylene) (TFB), or the like can be used.

(6) Light Emitting Layers 123

The light emitting layers 123, as described above, have a function of emitting light in an excited state generated by recombination of injected holes and electrons. Thus, the light emitting layers 123 are formed by using an organic material that can emit light and can be made into a film by using a wet printing method.

In particular, for example, the light emitting layers 123 are beneficially formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or the like, as described in JP H05-163488.

(7) Electron Transport Layer 124

An organic material with high electron transportability is used in the electron transport layer 124. The electron transport layer 124A may include a layer made of sodium fluoride. An example of an organic material that may be used in the electron transport layer 124B is a π electron low molecular weight organic material such as an oxadiazole derivative (OXD), a triazole derivative (TAZ), phenanthroline derivative (BCP, Bphen), or the like.

Further, the electron transport layer 124B may include a layer formed by doping a high electron transporting property organic material with a metal dopant selected from alkali metals or alkaline earth metals.

(8) Common Electrode Layer 125

An electrically conductive light-transmissive material is used as the common electrode layer 125A. For example, the common electrode layer 125A may be formed by using indium tin oxide (ITO), indium zinc oxide (IZO), or the like.

The common electrode layer 125B is formed by using silver (Ag), aluminium (Al), or the like as a thin film electrode.

(9) Sealing Layer 126

The sealing layer 126 is formed by using, for example, a light-transmissive material such as silicon nitride (SiN), silicon oxynitride (SiON), or the like. Further, a sealing resin layer made of a resin material such as acrylic resin, silicone resin, or the like may be provided on the layer formed by using the material such as silicon nitride (SiN), silicon oxynitride (SiON), or the like.

In the case of a top-emission type of display panel, the sealing layer 126 is formed by using a light-transmissive material.

(10) Joining Layer 127

The joining layer 127 is made of a material such as a resin adhesive, for example. For the joining layer 127, a light transmissive resin material such as acrylic resin, silicone resin, epoxy resin, or the like can be used.

(11) Upper Substrate 130

As the upper substrate 130, for example, a light transmissive material such as a glass substrate, a silica glass substrate, or a plastic substrate can be used.

(12) Color Filter Layer 128

As the color filter layer 128, a publicly known resin material (for example, as a commercially available product, color resists manufactured by JSR Corporation) or the like can be used.

(13) Light Shielding Layer 129

The light shielding layer 129 is made of a resin material that is primarily an ultraviolet curable resin (for example, ultraviolet curable acrylic resin material to which a black pigment is added. As the black pigment, for example, a light shielding material such as a carbon black pigment, a titanium black pigment, a metal oxide pigment, an organic pigment, or the like can be used.

5. Method of Manufacturing Display Panel 10

A method of manufacturing the display panel 10 is described with reference to drawings from FIG. 8A to FIG. 13B. Each of the drawings from FIG. 8A to FIG. 10D and from FIG. 12A to FIG. 13B is a schematic cross-section taken at a position corresponding to A1-A1 in FIG. 4 illustrating a state in a process of manufacturing the display panel 10.

(1) Preparing Substrate 100x

Figure 8A:
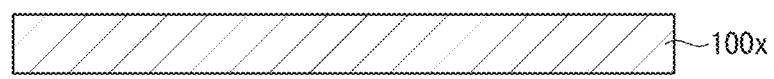
FIGS. 8A, 8B, 8C, 8D are schematic cross-section diagrams of cross-sections taken along the same plane as A1-A1 in FIG. 4, illustrating states of the organic EL display panel 10 during manufacture according to at least one embodiment.

The substrate 100x on which TFTs and wiring are formed is prepared. The substrate 100x can be manufactured by using a publicly known TFT manufacturing method (FIG. 8A).

(2) Forming Planarizing Layer 118

Figure 8B:

The planarizing layer 118 is formed by coating the substrate 100x with a component material (photosensitive resin material) of the planarizing layer 118 as a photoresist, and by planarizing the coated surface (FIG. 8B).

(3) Forming Pixel Electrodes 119, Dummy Electrodes 119E, and Hole Injection Layers 120A After forming a metal film by using a vapor phase growth method such as sputtering or vacuum deposition, patterning is performed by using photolithography and etching.

More specifically, first, after forming the planarizing layer 118, dry etching processing is applied to a surface of the planarizing layer 118 to perform cleaning prior to film formation.

Figure 8C:
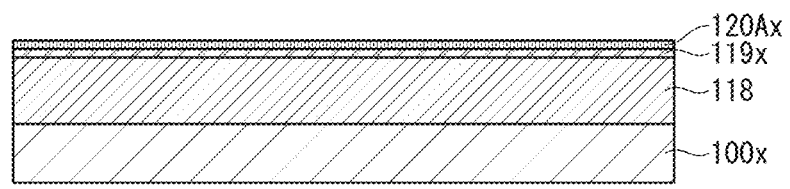

Next, after pre-film-formation cleaning of the surface of the planarizing layer 118, a second metal layer 119x for forming the pixel electrodes 119 is formed on the surface of the planarizing layer 118 by using a vapor phase growth method (FIG. 8C). According to the present embodiment, the second metal layer 119x is a film made of aluminum or an alloy that is primarily aluminum formed by using a sputtering method.

After pre-film-formation cleaning of a surface of the second metal layer 119x, a third metal layer 120Ax for forming the hole injection layers 120A is formed on the surface of the second metal layer 119x by using a vapor phase growth method (FIG. 8C). According to the present embodiment, the third metal layer 120Ax is formed by sputtering tungsten.

Figure 8D:
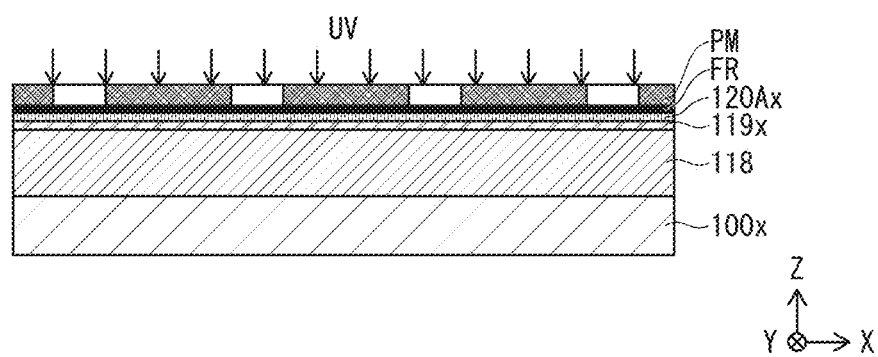

Subsequently, after applying a photoresist layer FR made of a photosensitive resin or the like, a photomask PM provided with defined openings is disposed thereon and irradiated with ultraviolet light to expose the photoresist and transfer the pattern of the photomask to the photoresist (FIG. 8D). Next, the photoresist layer FR is patterned by developing.

Subsequently, patterning of the third metal layer 120Ax and the second metal layer 119x is performed by etching processing via the patterned photoresist layer FR, thereby forming the hole injection layers 120A and the pixel electrodes 119.

Figure 9A:
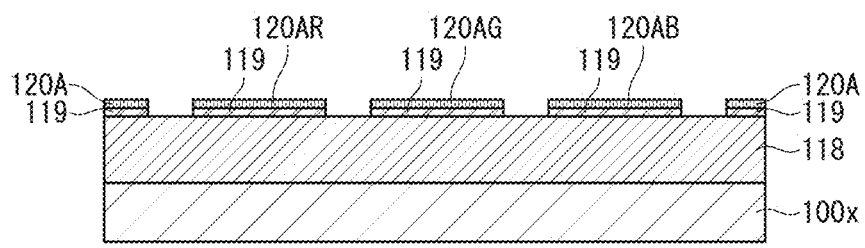
FIGS. 9A, 9B, 9C are schematic cross-section diagrams of cross-sections taken along the same plane as A1-A1 in FIG. 4, illustrating states of the organic EL display panel 10 during manufacture according to at least one embodiment.

Finally, the photoresist layer FR is peeled off, leaving the pixel electrodes 119 and the hole injection layers 120A patterned in the same shapes (FIG. 9A).

Similar to the method of forming the pixel electrodes 119, the dummy electrodes 119E are formed in a matrix on the substrate 100x in the region 10ne, as illustrated in FIG. 6. At this time, in the vicinity of the column direction ends of the substrate 100x, the dummy electrodes 119REtp, 119GEtp, 119BEtp are formed in the shapes illustrated in FIG. 6.

The formation of the pixel electrodes 119 in the region 10e of the substrate 100x and the formation of the dummy electrodes 119E in the region 10ne are performed at the same time by the same method.

(4) Forming Banks 122

Figure 9B:
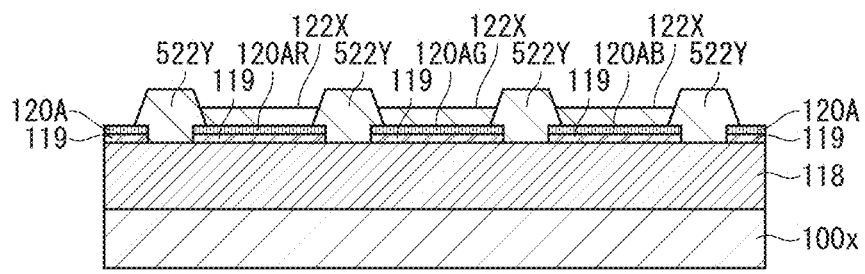

After forming the hole injection layers 120A of the hole injection layers 120, the banks 122 that partially cover the hole injection layers 120A are formed. In forming the banks 122, first the row banks 122X are formed and subsequently the column banks 522Y are formed, thereby forming the gaps 522z (FIG. 9B).

To form the banks 122, first, a film made of a material of the banks 122 (for example, a photosensitive resin material) is layered on the hole injection layers 120A by using a spin coating method or the like. Then the resin film is patterned to form the row banks 122X.

Patterning of the row banks 122X is performed by light exposure using a photomask above the resin film, developing, and baking (at approximately 230° C. for approximately 60 minutes).

Next, to form the column banks 522Y, a film made of a material of the column banks 522Y (for example, a photosensitive resin material) is layered on the hole injection layers 120A and the row banks 122X by using a spin coating method or the like. Forming the gaps 522z is performed by positioning a mask above the resin film, exposing it to light, then developing to pattern the resin film to form the gaps 522z and the column banks 522Y.

More specifically, when forming the column banks 522Y, a photosensitive resin film made of an organic photosensitive resin material such as acrylic resin, polyimide resin, novolac-type phenolic resin, or the like is formed. After drying to partially volatize solvent, a photomask provided with defined openings is overlaid, and ultraviolet irradiation is performed from above to expose a photoresist made of the photosensitive resin or the like, transferring the pattern of the photomask to the photoresist.

Next, insulating layers that are the column banks 522Y patterned by developing of the photosensitive resin are baked (at approximately 230° C. for approximately 60 minutes). Typically, a positive type of photoresist is used. According to a positive type of photoresist, portions exposed to light are removed by developing. The unexposed portions of the photoresist under the pattern mask remain without being developed.

As described above, the hole injection layers 120A are patterned per pixel unit by using photolithography and etching after a film made of metal (for example, tungsten) is formed by using a vapor phase growth method such as sputtering or vacuum deposition, but it is in the baking of the row banks 122X and the column banks 522Y that the metal is oxidized to complete the hole injection layers 120A.

The column banks 522Y extend in the column direction and alternate in the row direction with the gaps 522z.

In the region 10ne on the substrate 100x, near the edge in the column direction of the substrate 100x, in gaps between adjacent banks in the row direction of the column banks 522Y, the banks 522Y are formed such that the red end region 522zRtp, the green end region 522zGtp, and the blue end region 522zBtp have the shapes illustrated in FIG. 6. At this time, the dummy electrodes 119REtp, 119GEtp, 119BEtp are formed in the red end region 522zRtp, the green end region 522zGtp, and the blue end region 522zBtp, respectively.

(5) Forming Organic Functional Layers

Figure 9C:
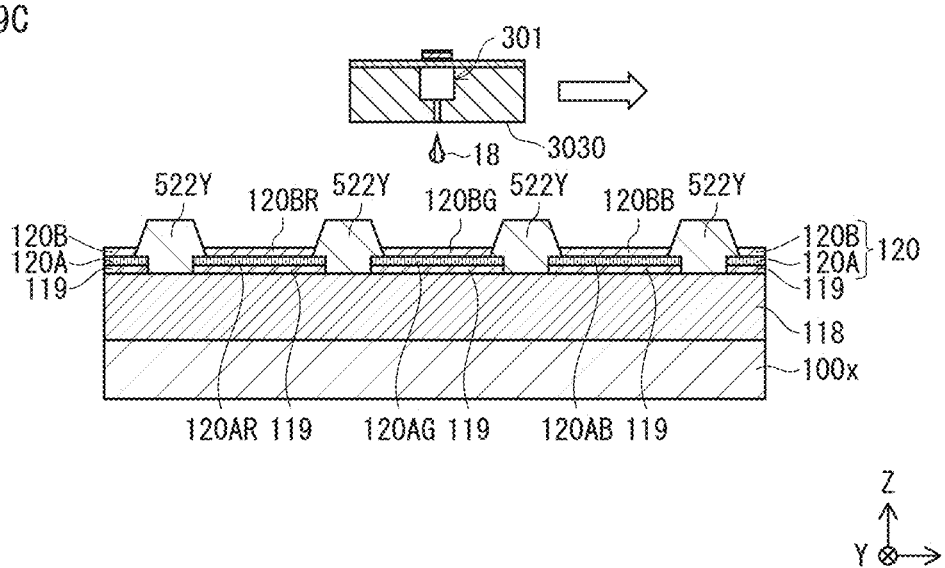

On the hole injection layers 120A of the hole injection layers 120 formed in the gaps 522z defined by the column banks 522Y including on and above the row banks 122X, the hole injection layers 120B of the hole injection layers 120, the hole transport layers 121, and the light emitting layers 123 are laminated in this order (FIG. 9C).

The upper layers 120B are formed by using an inkjet method to apply an ink including an electrically conductive polymer material such as PEDOT:PSS into the gaps 522z defined by the column banks 522Y, then removing a solvent by volatilization or by baking. Subsequently, patterning of each pixel unit may be performed by using photolithography and etching.

Figure 10A:
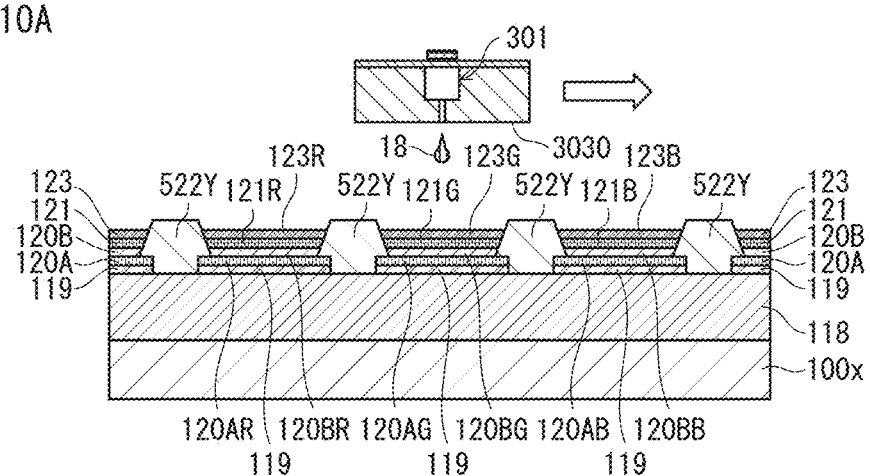
FIGS. 10A, 10B, 10C, 10D are schematic cross-section diagrams of cross-sections taken along the same plane as A1-A1 in FIG. 4, illustrating states of the organic EL display panel 10 during manufacture according to at least one embodiment.

The hole transport layers 121 are formed by using a wet process such an inkjet method or gravure printing method to apply ink including a material of the hole transport layers 121 into the gaps 522z defined by the column banks 522Y, then removing a solvent by volatilization or by baking (FIG. 10A). The method of applying ink for forming the hole transport layers 121 into the gaps 522z is the same as the method used for the hole injection layer 120B.

The light emitting layers 123 are formed by using an inkjet method to apply ink including a material of the light emitting layers 123 into the gaps 522z defined by the column banks 522Y, then baking (FIG. 10A). More specifically, in this process, inks 123RI, 123GI, and 123BI including R, G, and B organic light emitting layer material, respectively, are applied by using an inkjet method into the gaps 522z, which are sub pixel formation regions. The inks are then dried under low pressure and baked to form the light emitting layers 123R, 123G, and 123B. In applying the ink of the light emitting layers 123, a solution for forming the light emitting layers 123 is applied by using a droplet ejecting device.

Upon completion of application of ink for forming any one of the red light emitting layers, the green light emitting layers, and the blue light emitting layers with respect to the substrate 100x, another color of ink is applied with respect to the substrate 100x, then the third color of ink is applied. By repeating this process, three colors of ink are applied in order. As a result, red light emitting layers, green light emitting layers, and blue light emitting layers repeatedly alternate across the substrate 100x in the row direction.

As described above, sizes of the gaps 522zR, 522zB, 522zG are equal, and upper limits of volume of ink that can be held therein are equal. Here, in the wet process of forming the light emitting layers 123, adjustment of film thicknesses of the light emitting layers 123 of each of the RGB subpixels is performed by adjusting ratios of solid content in the inks 123RI, 123GI, 123BI including the R, G, B organic light emitting materials. More specifically, by setting the ratios of organic light emitting materials in the inks 123RI, 123GI, 123BI such that R>G>B (i.e., R light emitting layers have the highest ratio of organic light emitting material to solvent), the light emitting layers formed by evaporating solvent are defined such that the light emitting layers 123R>the light emitting layers 123G>the light emitting layers 123B, in terms of thickness of the light emitting layers. Note that in a case where the upper limits of volume of ink that can be held in the gaps 522zR, 522zB, 522zG are not equal, adjustment of film thicknesses of the light emitting layers 123 of RGB subpixels may be performed by changing amounts of ink dropped for R, G, B layers while keeping constant ratios of solid content in the inks 123RI, 123GI, 123BI. This is because setting amounts of solid content included in the ink dropped such that R>G>B means that the light emitting layers 123R>the light emitting layers 123G>the light emitting layers 123B, in terms of thickness of the light emitting layers.

Thus, thickness of the light emitting layers 123R is larger than thickness of the light emitting layers 123G, and thickness of the light emitting layers 123G is larger than thickness of the light emitting layers 123B. Thus, optical path lengths between the top surfaces of the light emitting layers 123 and the top surfaces of the pixel electrodes 119 can be set according to wavelengths of light emitted from the light emitting layers 123R, 123G, 123B, respectively.

In the region 10ne on the substrate 100x, near the column direction ends of the substrate 100x, in the gaps between adjacent banks in the row direction of the column banks 522Y, the red end region 522zRtp, the green end region 522zGtp, and the blue end region 522zBtp are filled by the inks 123RI, 123GI, 123BI, respectively. Thus, the light emitting layers 123REtp are laminated on the dummy electrodes 119REtp in the red end region 522zRtp, the light emitting layers 123GEtp are laminated on the dummy electrodes 119GEtp in the green end region 522zGtp, and the light emitting layers 123BEtp are laminated on the dummy electrodes 119BEtp) in the blue end region 522zBtp.

(Method of Uniform Application to Gaps 522z Between Column Banks 522Y)

Figure 11:
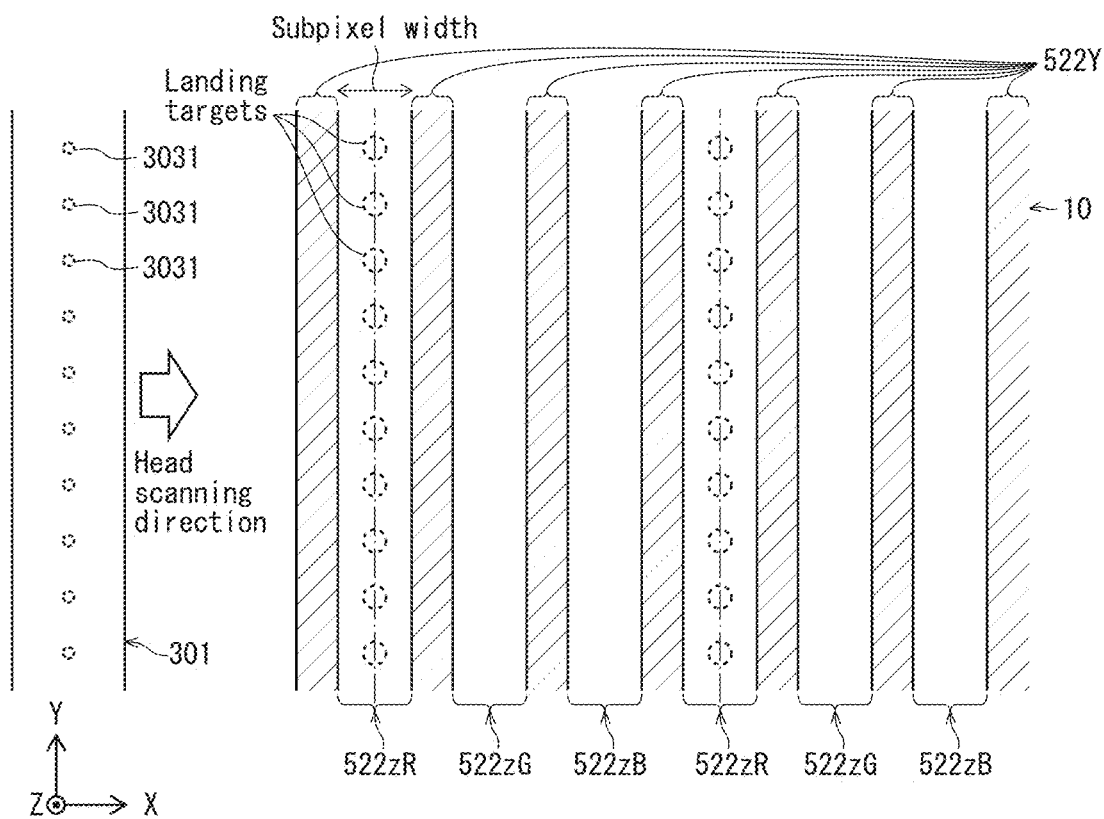
FIG. 11 is a schematic plan view diagram illustrating a process of application of ink for a light emitting layer to a gap between adjacent column banks 522Y on a substrate during manufacture of organic EL display panel 10 according to at least one embodiment.

The following is a detailed description of use of an inkjet method to apply ink of the light emitting layers 123 into the gaps 522z. FIG. 11 is a schematic plan view diagram illustrating a process of uniformly applying ink for forming light emitting layers to the gaps 522z between the column banks 522Y.

The following is a description of application of ink into gaps for one color (for example, ink for red gaps). The light emitting layers 123 extend continuously not only in the self-light-emission regions 100a but also across the non-self-light-emission regions 100b that are adjacent. Thus, when forming the light emitting layers 123, ink applied to the self-light-emission regions 100a can flow in the column direction via ink applied to the non-self-light-emission regions 100b, and when an ink drying process pertaining to the present embodiment is performed, film thickness of the light emitting layers 123 between pixels in the column direction can be levelled. However, in the non-self-light-emission regions 100b, ink flow is suppressed to an appropriate extent by the row banks 122X, which extend in the X direction and are low in height. Accordingly, large amounts of unevenness in film thickness in the column direction are unlikely to occur, and luminance evenness between pixels is improved.

According to the present application method, as illustrated in FIG. 11, the substrate 100x is placed on an operation table of the droplet ejecting device in a state in which the column banks 522Y extend in the Y direction, and while an inkjet head 301 in which nozzle holes are arranged in a line shape along the Y direction is moved relative to the substrate 100x in the X direction, ink aimed at landing targets set within the gaps 522z between the column banks 522Y is ejected from the nozzle holes to land on the landing targets.

Note that each region to which an ink amount of one of the light emitting layers 123 is applied is one region among three regions arranged side-by-side in the X direction.

When forming the light emitting layers 123 in three colors—RGB—an amount of ink to be ejected from nozzles is set according to a first condition and applied to a plurality of gaps of a first color, then an amount of ink to be ejected from nozzles is set according to a second condition and applied to a plurality of gaps of a second color, then an amount of ink to be ejected from nozzles is set according to a third condition and applied to a plurality of gaps of a third color, and in this way ink is sequentially applied to gaps of all three colors.

Further, ink may be sequentially applied to gaps of three colors by repeating a process of applying ink to gaps of a first color for a plurality of substrates, then applying ink to gaps of a second color for the plurality of substrates, then applying ink to gaps of a third color for the plurality of substrates.

Methods of forming the hole injection layers 120B of the hole injection layers 120, the hole transport layers 121, and the light emitting layers 123 are not limited to those described above, and ink may be dropped and applied by a publicly known method other than an inkjet method or a gravure printing method, such as a dispenser method, a nozzle coating method, a spin coating method, intaglio printing, letterpress printing, or the like.

(6) Forming of Electron Transport Layer 124

Figure 10B:
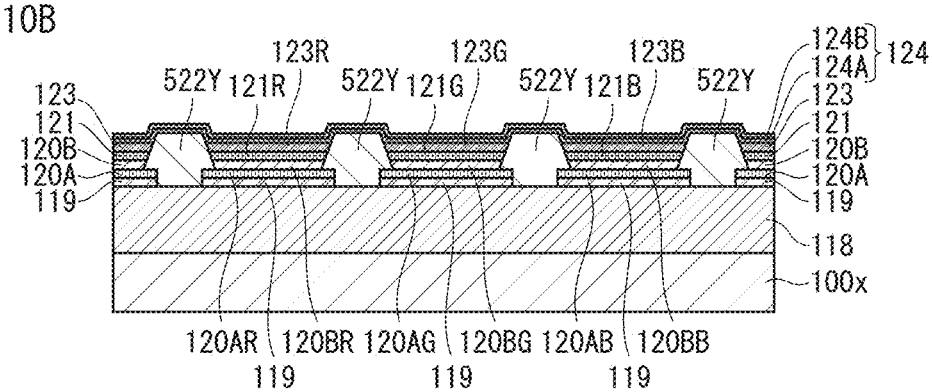

After forming the light emitting layers 123, the electron transport layer 124 is formed to be continuous across a display area of the display panel 10 by using a method such as vacuum deposition (FIG. 10B). Reasons for using vacuum deposition are to avoid damage to the light emitting layers 123, which are organic, and because, in a vacuum deposition method performed under high vacuum, molecules to form a film proceed directly in a direction normal to the substrate. The electron transport layer 124A is formed by vacuum deposition or the like of a metal oxide or fluoride on the light emitting layers 123, to have a film thickness from 1 nm to 10 nm, for example. On the electron transport layer 124A, the electron transport layer 124B is formed by co-evaporation of an organic material and a metal material, to have a film thickness from 10 nm to 50 nm, for example. Note that the above film thicknesses of the electron transport layers 124A, 124B are merely examples. The film thicknesses are not limited to the above values, and are set to thicknesses that are most appropriate for optical light extraction.

(7) Forming of Common Electrode Layer 125

After forming the electron transport layer 124, the common electrode layer 125 is formed to cover the electron transport layer 124. The common electrode layer 125 includes, in this order from the substrate 100x, the common electrode layer 125A made of a metal oxide and the common electrode layer 125B that is primarily metal layered on the common electrode layer 125A.

Figure 10C:
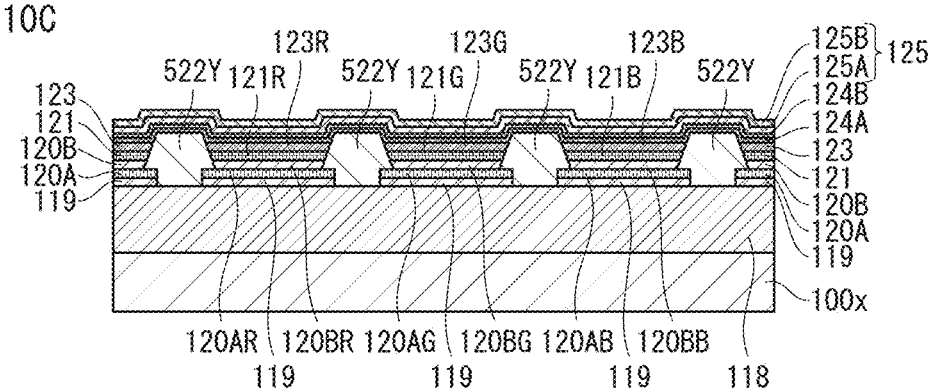

Of these, first, the common electrode layer 125A is formed by a method such as sputtering so as to cover the electron transport layer 124 (FIG. 10C). According to the present example, the common electrode layer 125A is formed by using a sputtering method to form a light-transmissive electrically-conductive layer of ITO, IZO, or the like.

Next, the common electrode layer 125B is formed on the common electrode layer 125A by using chemical vapor deposition (CVD), sputtering, or vacuum deposition (FIG. 10C). In the present example, the common electrode layer 125B is formed by depositing silver by using vacuum deposition.

(8) Forming Sealing Layer 126

Figure 10D:
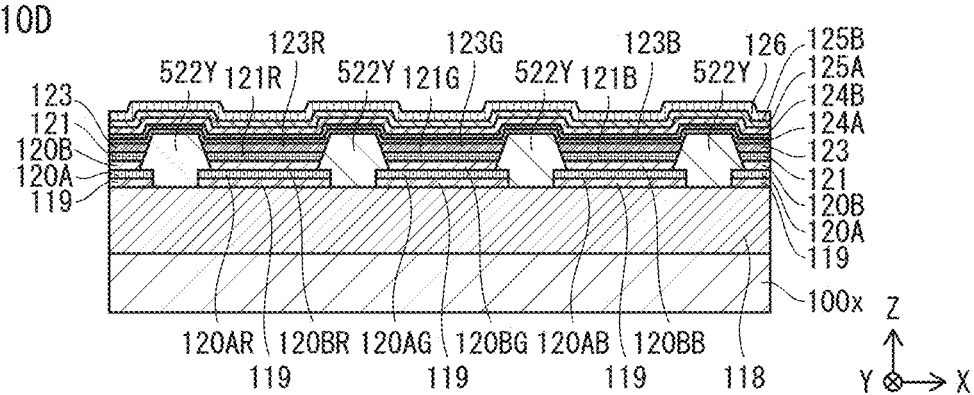

After forming the common electrode layer 125, the sealing layer 126 is formed to cover the common electrode layer 125 (FIG. 10D). The sealing layer 126 can be formed by using CVD, sputtering, or the like.

(9) Forming Color Filter Substrate 131

Next, an example of a manufacturing process of the color filter substrate 131 is described.

Figure 12A:
FIGS. 12A, 12B, 12C, 12D, 12E, 12F, 12G are schematic cross-section diagrams of cross-sections taken along the same plane as A1-A1 in FIG. 4, illustrating states of the organic EL display panel 10 during manufacture according to at least one embodiment.

The upper substrate 130, which is light-transmissive, is prepared, and the material of the light shielding layers 129 that is primarily an ultraviolet curable resin (for example, ultraviolet curable acrylic resin) material, to which a black pigment is added, is applied on one surface of the upper substrate 130 (FIG. 12A).

Figure 12B:
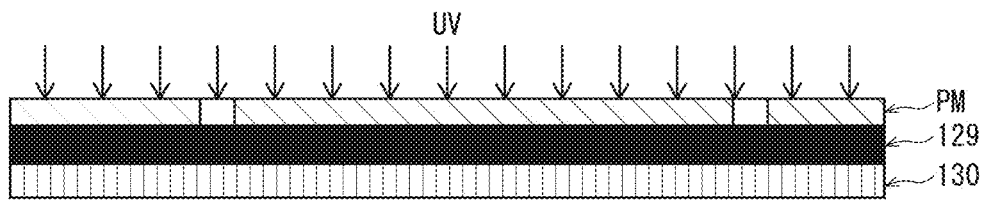

A pattern mask PM having defined openings is overlaid on an upper surface of the light shielding layer 129 and is irradiated from above with ultraviolet light (FIG. 12B).

Figure 12C:
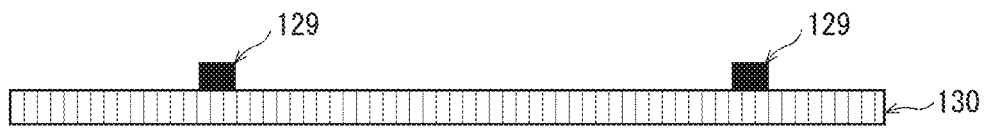

Then, by removing the pattern mask PM and uncured portions of the light shielding layer 129, developing, and curing, the light shielding layer 129 is completed and has, for example, substantially rectangular shapes in cross-section (FIG. 12C).

Figure 12D:
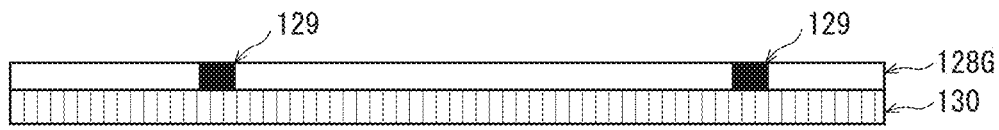

Next, a material 128G of the color filter layer 128 (in this example, the color filter layer 128G) that is primarily an ultraviolet curable resin component is applied to a surface of the upper substrate 130 on which the light shielding layer 129 is formed (FIG. 12D). Next, a defined pattern mask PM is placed, and ultraviolet irradiation is performed (FIG. 12E).

Figure 12E:
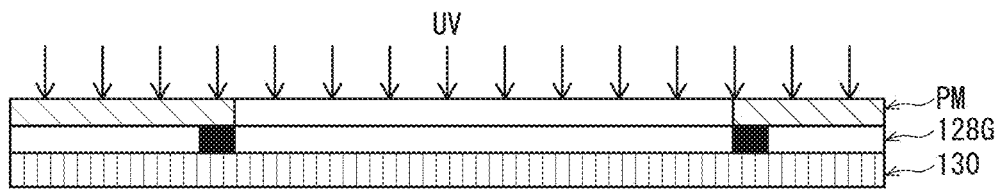
Figure 12F:
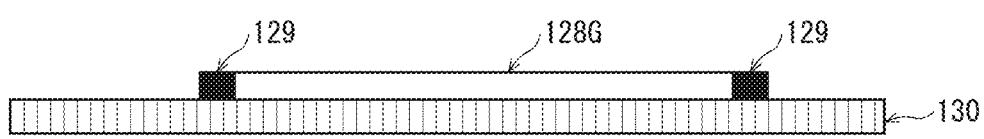

Subsequently, curing is performed, and the pattern mask PM and uncured portions of the material 128G are removed by developing to form the color filter layer 128G (FIG. 12F).

Figure 12G:
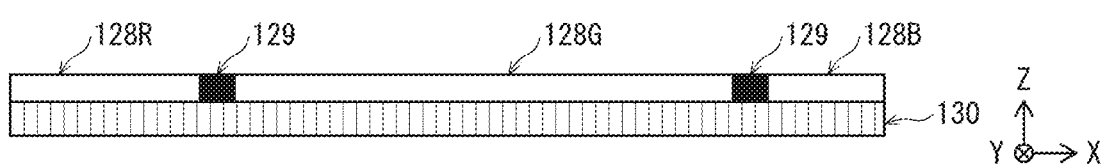

The color filter layers 128R and 128B are formed by performing the processes in FIGS. 12D, 12E, and 12F with respect to color filter materials of each respective color (FIG. 12G). A commercially available color filter product may be used instead of the color filter materials 128R, 128G, 128B. Thus, the color filter substrate 131 is formed.

(10) Joining of Color Filter Substrate 131 and Back Panel

Figure 13A:
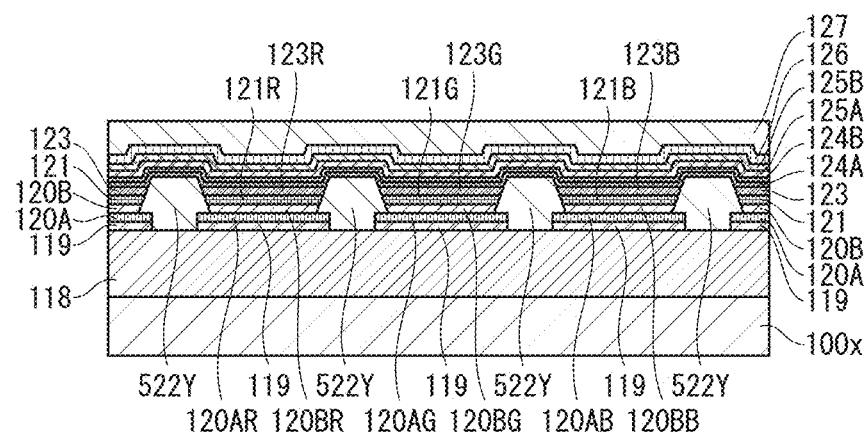
FIG. 13A and FIG. 13B are schematic cross-section diagrams of cross-sections taken along the same plane as A1-A1 in FIG. 4, illustrating states of the organic EL display panel 10 during manufacture according to at least one embodiment.

Next, a material of the joining layer 127 that is primarily an ultraviolet curable resin such as acrylic resin, silicone resin, epoxy resin, or the like, is applied to a back panel that includes every layer from the substrate 100x to the sealing layer 126 (FIG. 13A).

Figure 13B:
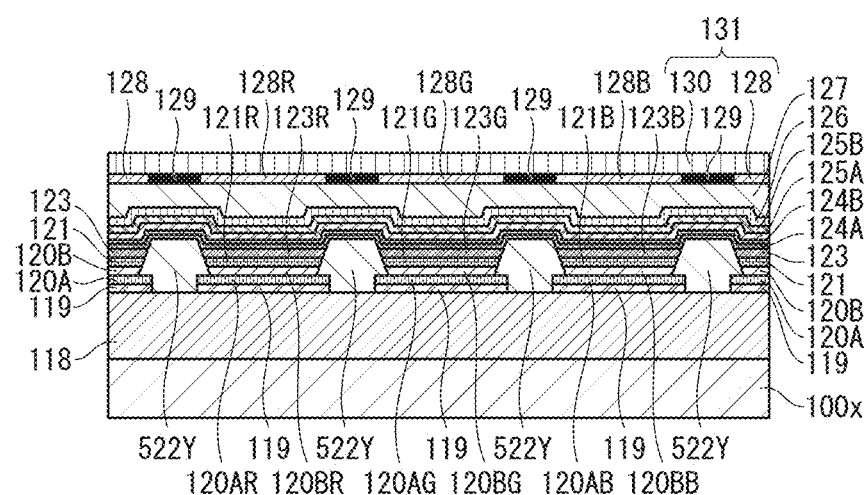

Next, the applied material is irradiated with ultraviolet light, and the back panel and the color filter substrate 131 are joined while matching positions relative to each other. No gas should enter between the back panel and the color filter substrate 131 at this time. Finally, a sealing process is completed by baking, thus completing the display panel 10 (FIG. 13B).

6. Film Thickness Variation of Light Emitting Layers 123 Near Column Direction Ends of Region 10e The following is a description of film thickness variation of the light emitting layers 123 near column direction ends of the region 10e of the display panel 10.

6.1. Testing Method

Figure 14:
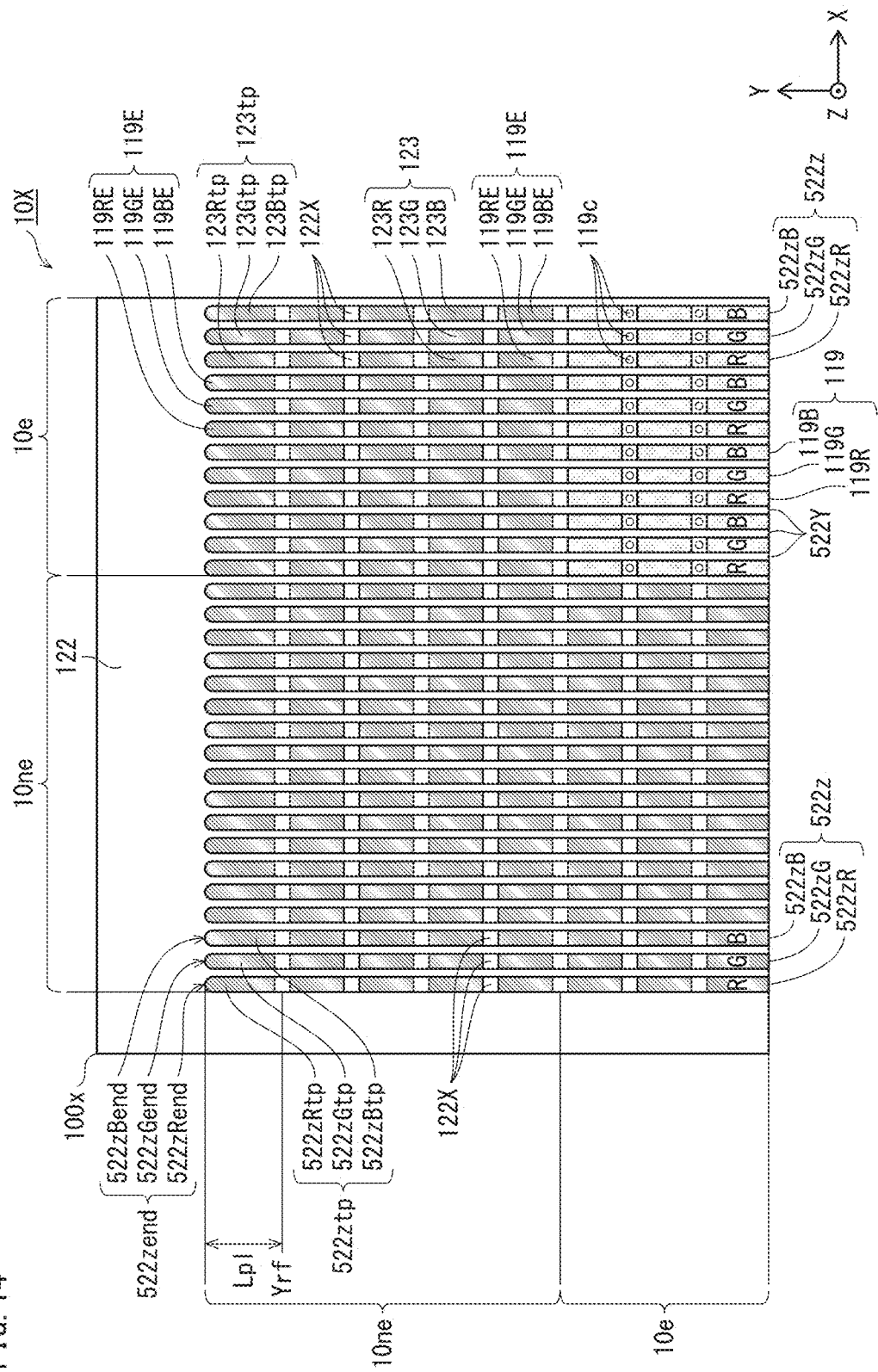
FIG. 14 is a schematic plan view diagram illustrating a reference example display panel.

The inventor measured film thickness distribution of the light emitting layers 123 in the region 10e, for an embodiment of the display panel 10 and a reference example. The embodiment is as illustrated in FIG. 6. FIG. 14 is a schematic plan view diagram illustrating a reference example display panel. According to the reference example, positions in the column direction of column direction ends 522zend of the gaps 522z in the region lane on the substrate 100x are the same regardless of emission colors of the light emitting layers 123 arranged in the gaps 522z. Using the substrates of the embodiment and the reference example, an ink head I was moved relative to the substrate 100x in the X direction while a nozzle column of the ink head I was parallel to the Y direction, in order to form the light emitting layers 123, in order to complete the display panels.

Figure 15:
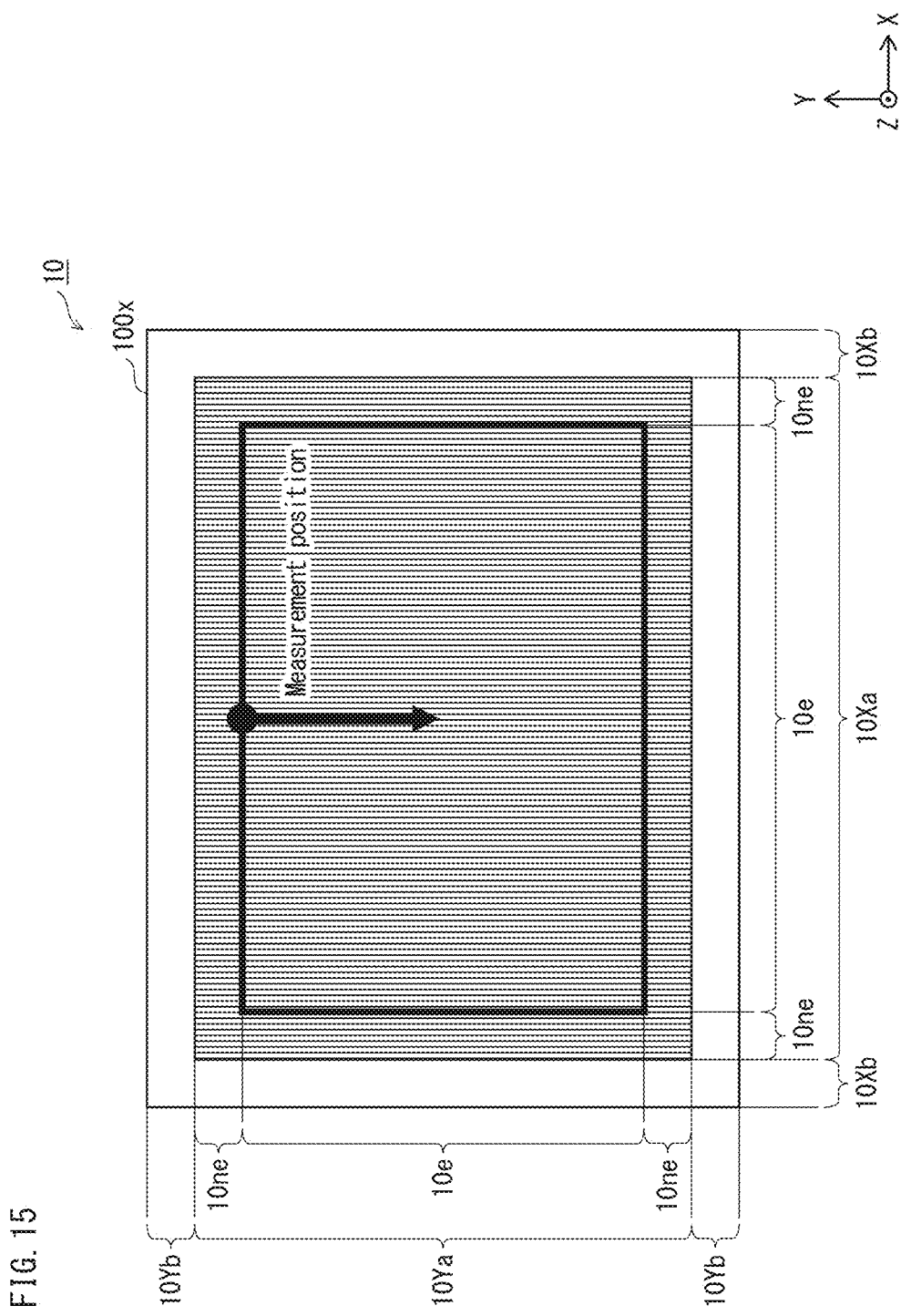
FIG. 15 is a schematic plan view diagram illustrating a film thickness measurement position of organic EL display panel 10 according to at least one embodiment.

FIG. 15 is a schematic plan view diagram illustrating a film thickness measurement position of the display panel 10. For both the embodiment and the reference example of the display panel 10, distribution of film thicknesses of the light emitting layers 123 on the substrate 100*x* along an X direction center line of the region 10*e* was measured for approximately 50 pixels towards a center portion of the substrate 100*x* from the column direction end of the region 10*e* of the gaps 522*z*. Next, a difference in magnitude of film thickness variation of the organic light emitting layers 123R, 123G, 123B near the column direction ends of the region 10*e* was evaluated. Further, with respect to the embodiment and the reference example, image signals were applied to each pixel in the column direction, driving light emission, and luminance distribution of each color—RGB was measured.

6.2. Film Thickness Measurement Results

Figure 16A:
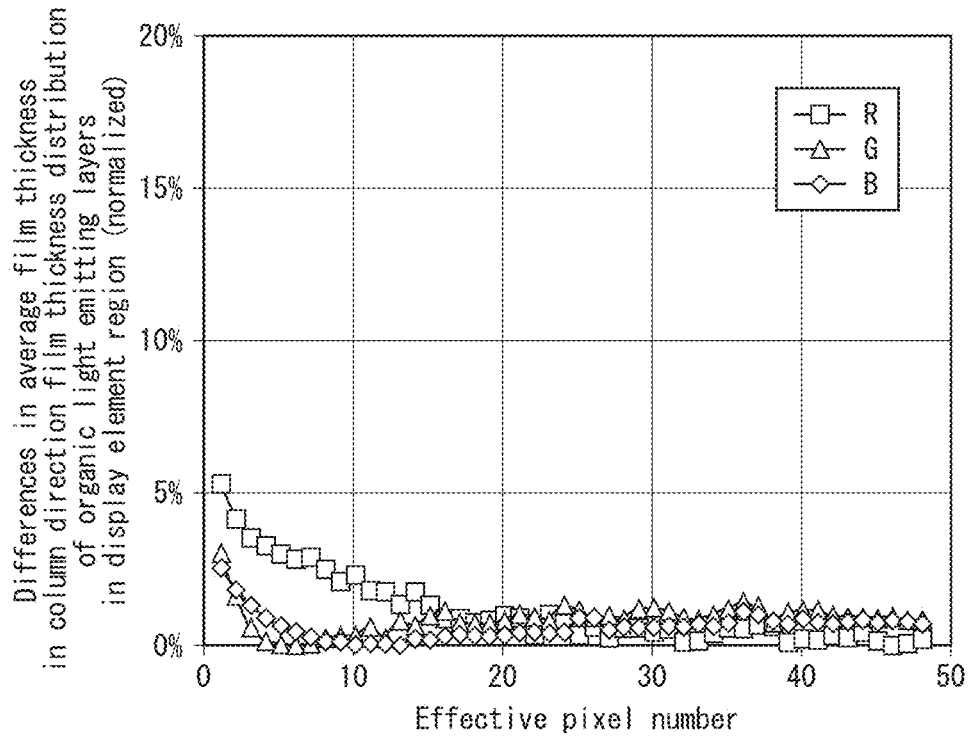
FIG. 16B illustrates film thickness measurement results for organic light emitting layers near column bank ends of the same region of an organic EL display panel of a reference example.
Figure 16B:
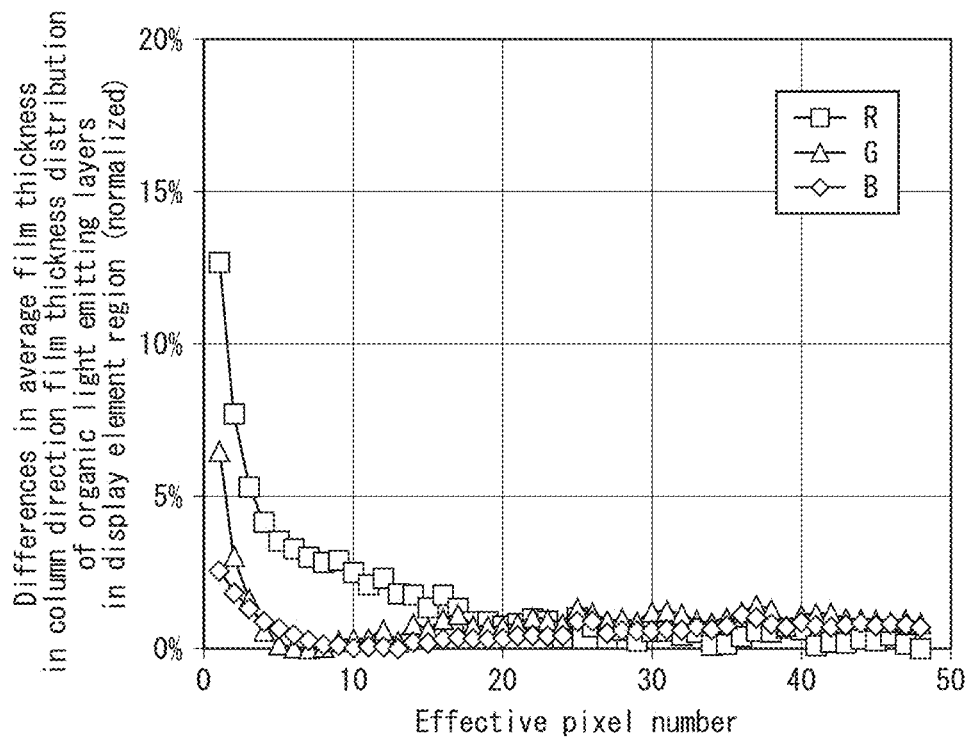
Figure 17A:
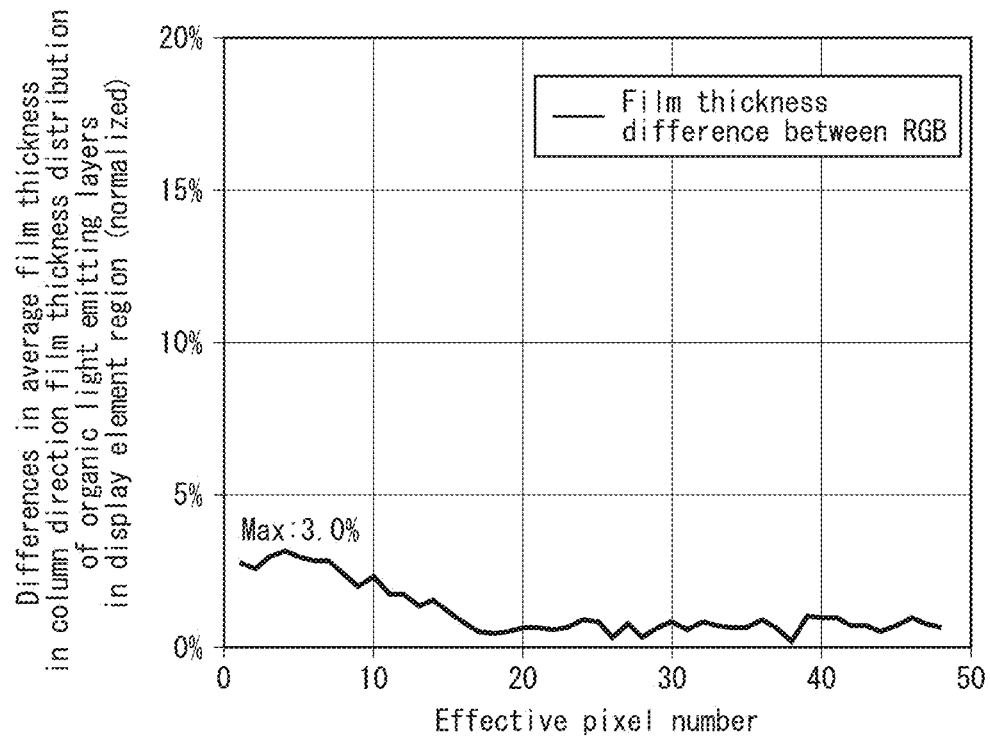
FIG. 17A illustrates film thickness difference between organic light emitting layers 123R, 123G, 123B near column bank ends of the region 10e of organic EL display panel 10 according to at least one embodiment.
Figure 17B:
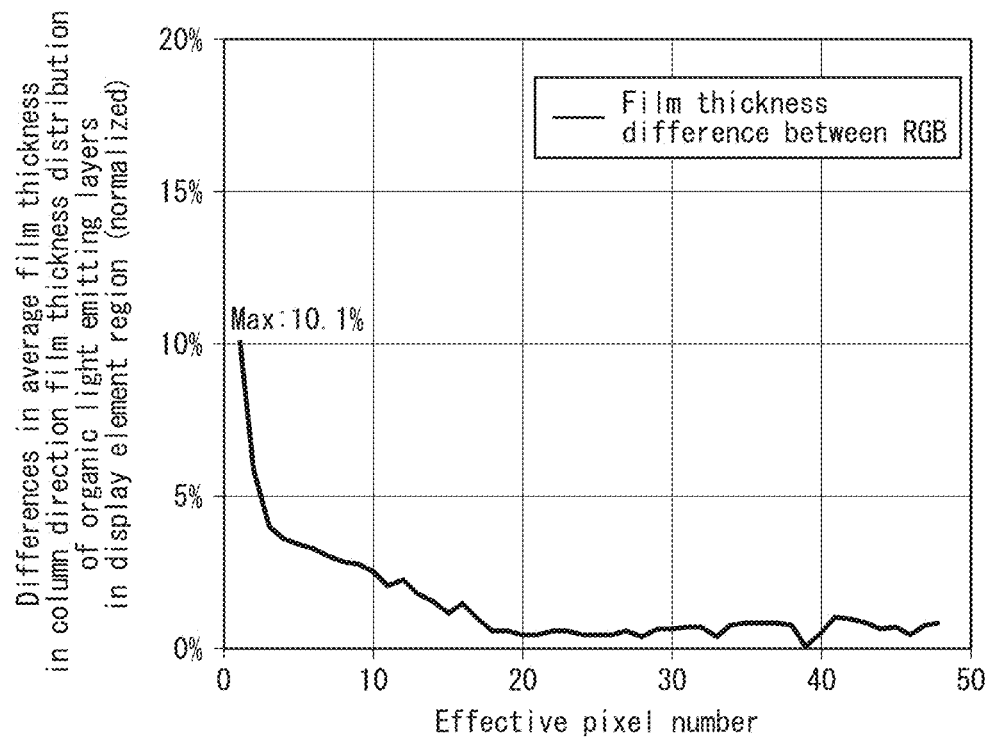
FIG. 17B illustrates film thickness difference between organic light emitting layers near column bank ends of the same region of an organic EL display panel of a reference example.

FIG. 16A illustrates film thickness measurement results for organic light emitting layers 123R, 123G, 123B near column bank ends of the region 10*e* of the organic EL display panel 10 according to at least one embodiment, and FIG. 16B illustrates film thickness measurement results for organic light emitting layers near column bank ends of the same region of the reference example. Differences between film thicknesses of the organic light emitting layers 123R, 123G, 123B near column bank ends in the region 10*e* and average film thicknesses of the organic light emitting layers 123R, 123G, 123B in the gaps 522*z* were obtained and normalized, and are indicated in FIG. 16A and FIG. 16B. FIG. 17A illustrates film thickness difference between organic light emitting layers 123R, 123G, 123B near column bank ends of the region 10*e* of the organic EL display panel 10 according to at least one embodiment, and FIG. 17B illustrates film thickness difference between organic light emitting layers near column bank ends of the same region of the reference example. Differences between i) differences between film thicknesses of the organic light emitting layers 123R, 123G, 123B near column bank ends in the region 10*e* and ii) differences between average film thicknesses in the region 10*e* of the organic light emitting layers 123R, 123G, 123B in the gaps 522*z* were obtained and normalized, and are indicated in FIG. 17A and FIG. 17B.

As shown in FIG. 1613, according to the reference example, differences in average film thickness in the region 10*e* of light emitting layer film thickness near the column direction ends of the region 10*e* are less than 2% for RUB in a range from pixel 18 to pixel 48, but in a range from pixel 1 to pixel 3 near the column direction end of the region 10*e*, the differences in average film thicknesses of the light emitting layers increase. Among RGB light emitting layers, differences in film thicknesses between the light emitting layers 123R ranged from approximately 5.3% to approximately 12.7%, differences in film thicknesses between the light emitting layers 123G ranged from approximately 1.6% to approximately 6.5 and differences in film thicknesses between the light emitting layers 123B ranged from approximately 1.3% to 2.6%. It can be understood that there are differences between R, G, and B in terms of differences between average film thicknesses of light emitting layers, and film thicknesses of the light emitting layers 123R increase more conspicuously than film thicknesses of the light emitting layers 123G, 123B. Quantitatively, as illustrated in FIG. 17B, it can be understood that differences in film thickness variation between R, G, and B are less than 2% between R, G, and B in a range from pixel 18 to pixel 48, but sharply increases to a range from approximately 4% to approximately 10.1% (maximum value 10.1%) in a range from pixel 1 to pixel 3.

In comparison, according to the embodiment, as shown in FIG. 16A, a difference in average film thicknesses of light emitting layers is less than 2% for R, G, and B in a range from pixel 18 to pixel 48. In a range from pixel 1 to pixel 3 near the column direction end of the region 10*e*, a difference in average film thickness of light emitting layers increases for each color. Film thickness differences between the light emitting layers 123R are from approximately 3.5% to approximately 5.3%, film thickness differences between the light emitting layers 123G are from approximately 0.6% to approximately 3%, and film thickness differences between the light emitting layers 123B are from approximately 1.3% to approximately 2.6%. The differences between average film thicknesses of the light emitting layers between R, G, and B are reduced, and in a. range from pixel 1 to pixel 3 near the column direction end of region 10*e*, a conspicuous increase in film thicknesses of the light emitting layers 123R and the light emitting layers 123G over film thicknesses of the light emitting layers 123B cannot be seen. Quantitatively, as illustrated in FIG. 17A, when compared to the reference example it can be understood that, in a range from pixel 18 to pixel 48, differences in film thickness variation between R, G, and B are less than 2%, but in a range from pixel 1 to pixel 3, differences in film thickness variation between R, G and B are reduced to a range approximately equal to or less than 3% (maximum value 3.0%).

From the above results it was confirmed that, in the display panel 10, differences between R, G, and B of size of film thickness variation between organic light emitting layers near the column direction ends of the display element region 10*e* are decreased relative to those of the reference example.

6.2. Film Thickness Measurement Results

The following is an analysis of the film thickness measurement results of the light emitting layers 123 obtained from the display panel 10.

(Reference Example)

As illustrated in FIG. 16B, according to the reference example, in the range from pixel 1 to pixel 3 near the column end of the region 10*e*, differences in average film thicknesses in the region 10*e* of light emitting layer thicknesses near the column ends of the region 10*e* increase for each color R, G, and B. The reason for this is believed to be because drying time is shorter in a gap end portion than in a gap center portion, meaning solid content is deposited in a short time to form layers made of organic light emitting material.

The light emitting layers 123 are formed by using a wet process, such as an inkjet method, to apply ink including a material of the organic light emitting layers of R, G, or B into the gaps 522*z* defined by the column banks 522Y, then baking. At this time, from ink of the light emitting layers 123 applied on the substrate 100*x*, solvent starts to dry from the gap end regions 522*ztp* of the gaps 522*z*, and as solvent evaporates from the ink from the gap end portion of the gaps 522*z*, only the solid content does not volatilize and is deposited to form a layer of organic light emitting material. The reason for this is that, in the wet process, in the process of evaporating and drying solvent of the ink, an evaporation rate of the solvent is higher in a peripheral portion of a film forming area than in a central portion of the film forming area because solvent vapor concentration is lower. Thus, the gap end portion where the drying time is short and the solid content deposits in a short time tends to have a larger film thickness of a layer made of organic light emitting material than the gap central portion where the drying time is longer and the solid content takes a longer time to deposit. As a result, in the reference example, in a range from pixel 1 to pixel 3 near the column direction end of the region 10*e* where distance from the gap end portion is relatively short, differences in film thickness increase for each of R, G, and B colors.

As illustrated in FIG. 16B, in the reference example, the increases in film thicknesses are conspicuous near the column direction ends of the region 10e, and in order of conspicuity, the light emitting layers 123R>the light emitting layers 123G>the light emitting layers 123B. The reason for this is thought to be that film thicknesses are designed such that thickness of the light emitting layers 123R>thickness of the light emitting layers 123G>thickness of the light emitting layers 123B.

As described above, in each RGB subpixel, optical distance between the top surfaces of the light emitting layer 123 and the top surfaces of the pixel electrode 119 are set according to wavelengths of light emitted from the light emitting layers 123R, 123G, 123B, respectively, and the optical resonator structure is formed such that light components of each color constructively interfere with each other. Thus, thickness of the light emitting layers 123R is larger than thickness of the light emitting layers 123G and thickness of the light emitting layers 123G is larger than thickness of the light emitting layers 123B. The light emitting layers 123 are formed by using a wet process, in which i) ink including organic light emitting layer material is applied to the gaps 522z, then dried, ii) sizes of the gaps 522zR, 522zB, 522zG are equal, and iii) upper limits of volumes of ink that can be held are equal. Accordingly, adjustment of film thicknesses of the light emitting layers 123 of each of the RGB subpixels is performed by adjusting ratios of solid content in the inks 123RI, 123GI, 123BI including the R, G, B organic light emitting materials.

More specifically, by setting the ratios of organic light emitting materials in the inks 123RI, 123GI, 123BI such that R>G>B (R light emitting layers have the highest ratio of organic light emitting material to solvent), thicknesses of the light emitting layers formed by evaporating solvent are defined such that the thickness of the light emitting layers 123R>the thickness of the light emitting layers 123G>the thickness of the light emitting layers 123B. As a result, amounts of solid content included in the ink in the gap end portion are set such that the ink 123RI>the ink 123GI>the ink 123BI, and therefore an increase in conspicuity of film thickness increase also increases near the column direction ends of the region 10e in the order of the light emitting layers 123R>the light emitting layers 123G>the light emitting layers 123B.

As illustrated in FIG. 16B, according to the reference example, near the column direction end of the region 10e, the film thickness differences of the light emitting layers 123R range from approximately 5.3% to approximately 12.7%, the film thickness differences of the light emitting layers 123G range from approximately 1.6% to approximately 6.5%, and the film thickness differences of the light emitting layers 123B range from approximately 1.3% to approximately 2.6%. A difference is found in the differences between average film thicknesses between R, G, and B. In each RGB subpixel, the optical distance between the top surface of the light emitting layer 123 and the top surface of the pixel electrode 119 is set according to the wavelength of emitted light, forming an optical resonator structure in which the light components of the corresponding color constructively interfere with each other. Accordingly, the greater the deviation from average film thickness, the more the optical resonator effect decreases, and therefore in the order of the light emitting layers 123R>the light emitting layers 123G>the light emitting layers 123B, luminance decreases conspicuously near the column direction end of the region 10e, and as a result of RGB luminance decrease unevenness, uneven light emission properties (shift in color tone of emitted light) occur near the column direction end of the region 10e.

(Embodiment)

As illustrated in FIG. 16A, the differences in average film thicknesses of the light emitting layers is such that, in the range from pixel 1 to pixel 3 near the column end direction of the region 10e, the film thickness differences of the light emitting layers 123R are in a range from approximately 3.5% to approximately 5.3%, the film thickness differences of the light emitting layers 123G are in a range from approximately 0.6% to approximately 3%, and the film thickness differences of the light emitting layers 123B are in a range from approximately 1.3% to approximately 2.6%. When compared to the results of the reference example, it can be seen that the amount of increase from the average film thickness is reduced for the light emitting layers 123R, 123G. That is, the trend of a conspicuous increase in film thicknesses of the light emitting layers 123R, 123G relative to the film thicknesses of the light emitting layers 123B in a range from pixel 1 to pixel 3 near the column direction end of the region 10e seen in the reference example (FIG. 16B) is not seen in FIG. 16A.

In the display panel 10 according to the embodiment, as illustrated in FIG. 6, in the region 10ne surrounding the region 10e, the positions in the column direction of the column direction ends 522zend of the gaps 522z in the region 10ne are different according to light emission color of the light emitting layers 123 disposed in the gaps 522z, such that, in terms of distance from a column direction periphery of the region 10e, the column direction ends 522zRend of the red gaps 522zR>the column direction ends 522zGend of the green gaps 522zG>the column direction ends 522zBend of the blue gaps, i.e., the column direction ends 522zRend are closest to the column direction edge of the substrate 100x.

Accordingly, in the display panel 10 pertaining to the embodiment, the distance between the column direction ends of the gaps 522z in the region 10e and the column direction ends 522zend of the gaps 522z is set such that the gaps 522zR>the gaps 522zG>the gaps 522zB, and therefore in the order R>G>B, the effect of film thickness increase in the column direction ends 522zend of the gaps 522z of portions of the light emitting layers 123 in the column end portion of the region 10e can be reduced. With respect to the column direction ends 522zBend of the gaps 522zB where there is no structural difference between the embodiment and the reference example, the film thickness differences between the light emitting layers 123B indicate the same results in a range from approximately 1.3% to approximately 2.6%.

That is, in the display panel 10, length in the column direction of each of the light emitting layers 123REtp formed in the red end region 522Rtp is greater than length in the column direction of each of the light emitting layers 123GEtp formed in the green end region 522zGtp, and volume of each of the light emitting layers 123REtp is greater than volume of each of the light emitting layers 123GEtp. Further, length in the column direction of each of the light emitting layers 123GEtp is greater than length in the column direction of each of the light emitting layers 123BEtp formed in the blue end region 522zBtp, and volume of each of the light emitting layers 123GEtp is greater than volume of each of the light emitting layers 123BEtp).

According to this structure, the display panel 10, when compared to a conventional structure, can reduce the size of variation in film thicknesses between RGB colors of organic light emitting layers 123 near column direction ends of the region 10e, and can suppress unevenness in light emission properties near column direction ends of the region 10e.

7. Review

As described above, the display panel 10 pertaining to at least one embodiment includes the substrate 100x, the individual electrodes 119, 119E, the column banks 522Y, the organic light emitting layers 123R, 1236, 123B, and the counter electrode layer 125. The individual electrodes 119, 119E are disposed above the substrate 100x and arranged in the matrix. The column banks 522Y are disposed above the substrate 100x at least between row direction edges of the individual electrodes 119, 119E, the column banks 522Y extending in the column direction and arranged side by side along the row direction. The organic light emitting layers 123R, 123E, 123B are disposed in gaps 522z between the column banks 522Y and are each continuous in the column direction between column direction ends of the column banks 522Y. The organic light emitting layer 123R is disposed in the gap 522zR and the organic light emitting layers 123G, 123B are disposed in the gaps 522zG, 522zB. The gaps 522zR, 522zG, 522zB are adjacent to each other in the row direction. The counter electrode layer 125 is disposed above the organic light emitting layers 123R, 123G, 123B. The individual electrodes 119, 119E consist of the pixel electrodes 119 disposed in the display region 10e centrally located in plan view of the substrate 100x and the dummy electrodes 119E disposed in the peripheral region 10ne surrounding the display region 10e. Average film thickness of the organic light emitting layer 123R in the display region 10e is greater than average film thickness of the organic light emitting layers 123G, 123B in the display region 10e. In plan view of the substrate 100x, the organic light emitting layer 123Rtp in the gap end region 522zRtp extending in the column direction from the column direction end 522zRend of the gap 522zR to the reference position Yrf the defined distance Lpl from the column direction end 522zRend of the gap 522zR towards the display region 10e and within the peripheral region 10ne has a volume greater than the volumes of the organic light emitting layers 123Gtp, 123Btp in the gap end regions 522zGtp, 522zBtp extending in the column direction from the column direction ends 522zGend, 522zRend of the gaps 522zG, 522zB to the reference position Yrf.

According to at least one embodiment of the display panel 10, the length in the column direction of the gap end region 522zRtp is greater than the length in the column direction of the gap end regions 522zGtp, 522zBtp.

According to at least one embodiment of the display panel 10, the wavelength of light emitted by the organic light emitting layer 123R is longer than the wavelengths of light emitted by the organic light emitting layers 123G, 123B.

According to at least one embodiment of the display panel 10, the ratio of the volume of the organic light emitting layer 123Rtp in the gap end region 522zRtp to the average film thickness in the display region 10e of the organic light emitting layer 123R (volume value of organic light emitting layer in gap end region normalized by average film thickness of display region (volume/average film thickness)) is greater than the ratios of the volume of the organic light emitting layers 123Gtp, 123Btp in the gap end regions 522zGtp, 522zBtp to the average film thickness in the display region 10e of the organic light emitting layers 123G, 123B. According to at least one embodiment of the display panel 10, the wavelength of light emitted by the organic light emitting layer 123G is longer than the wavelength of light emitted by the organic light emitting layer 123B.

According to this structure, in a panel structure in which functional layers elongated in the column direction are arranged side by side, a difference of magnitude of film thickness variation near the column direction ends of the display element region 10e between different colors of the organic light emitting layers 123 can be reduced. As a result, a difference between RGB colors in terms of luminance unevenness near column direction ends of the display element region 10e is reduced, and unevenness in light emission properties near the column direction ends can be suppressed.

The method of manufacturing the display panel 10 pertaining to at least one embodiment includes preparing the substrate 100x, forming the individual electrodes 119, 119E above the substrate 100x arranged in the matrix, forming the column banks 522Y, applying the inks, forming the organic light emitting layers 123R, 123G, 123B, and forming the counter electrode layer 125. The column banks 522Y are formed above the substrate 100x at least between the row direction edges of the individual electrodes 119, 119E, extending in the column direction and arranged side by side along the row direction. The first, second, and third inks are applied into the entire lengths of the gaps 522zR, 522zG, 522zB between the column direction ends of the column banks 522Y. The gaps 522zR, 522zG, 522zB are adjacent to each other in the row direction. The first organic light emitting material included in the first ink is different from the second and third organic light emitting materials included in the second and third inks, respectively, and the second and third organic light emitting materials are also different from each other. The organic light emitting layer 123R is formed by drying the first ink, the organic light emitting layer 123G is formed by drying the second ink, and the organic light emitting layer 123B is formed by drying the third ink. The counter electrode layer 125 is formed above the organic light emitting layers 123R, 123G, 123B. The individual electrodes 119, 119E consist of the pixel electrodes 119 and the dummy electrodes 119E, and in the forming of the individual electrodes 119, 119E, the pixel electrodes 119 are disposed inn the display region 10e centrally located in plan view of the substrate 100x and the dummy electrodes 119E are disposed in the peripheral region 10ne surrounding the display region 10e. In the forming of the organic light emitting layers 123R, 123G, 123B, the average film thickness of the organic light emitting layer 123R in the display region 10e is made to be greater than the average film thicknesses of the organic light emitting layers 123G, 123B in the display region 10e. In plan view of the substrate, the organic light emitting layer 123Rtp in the gap end region 522zRtp extending in the column direction from the column direction end 522zRtp of the gap 522zR to the reference position Yrf the defined distance Lpl from the column direction end 522zRtp of the gap 522zR towards the display region 10e and within the peripheral region 10ne is made to have a volume greater than the volumes of the organic light emitting layers 123Gtp, 123Btp in the gap end regions 522zGtp, 522zBtp extending in the column direction from the column direction ends 522zGtp, 522zBtp of the gaps 522zG, 522zB to the reference position Yrf.

According to this method, when manufacturing a panel structure in which functional layers elongated in the column direction are arranged side by side, the display panel 10 can be manufactured that reduces a difference of magnitude of film thickness variation near the column direction ends of the display element region 10e between different colors (RGB) of the organic light emitting layers 123.

8. Modifications

The display panel 10 pertaining to at least one embodiment has been described, but the present disclosure is not limited to the embodiment described above. For example, various modifications conceivable by a person having ordinary skill in the art, and any combination of elements and functions of embodiments and modifications that do not depart from the spirit of the present invention are also included in the present disclosure. The following describes modifications of the display panel 10 as examples of such embodiments.

(1) Modification 1

Figure 18:
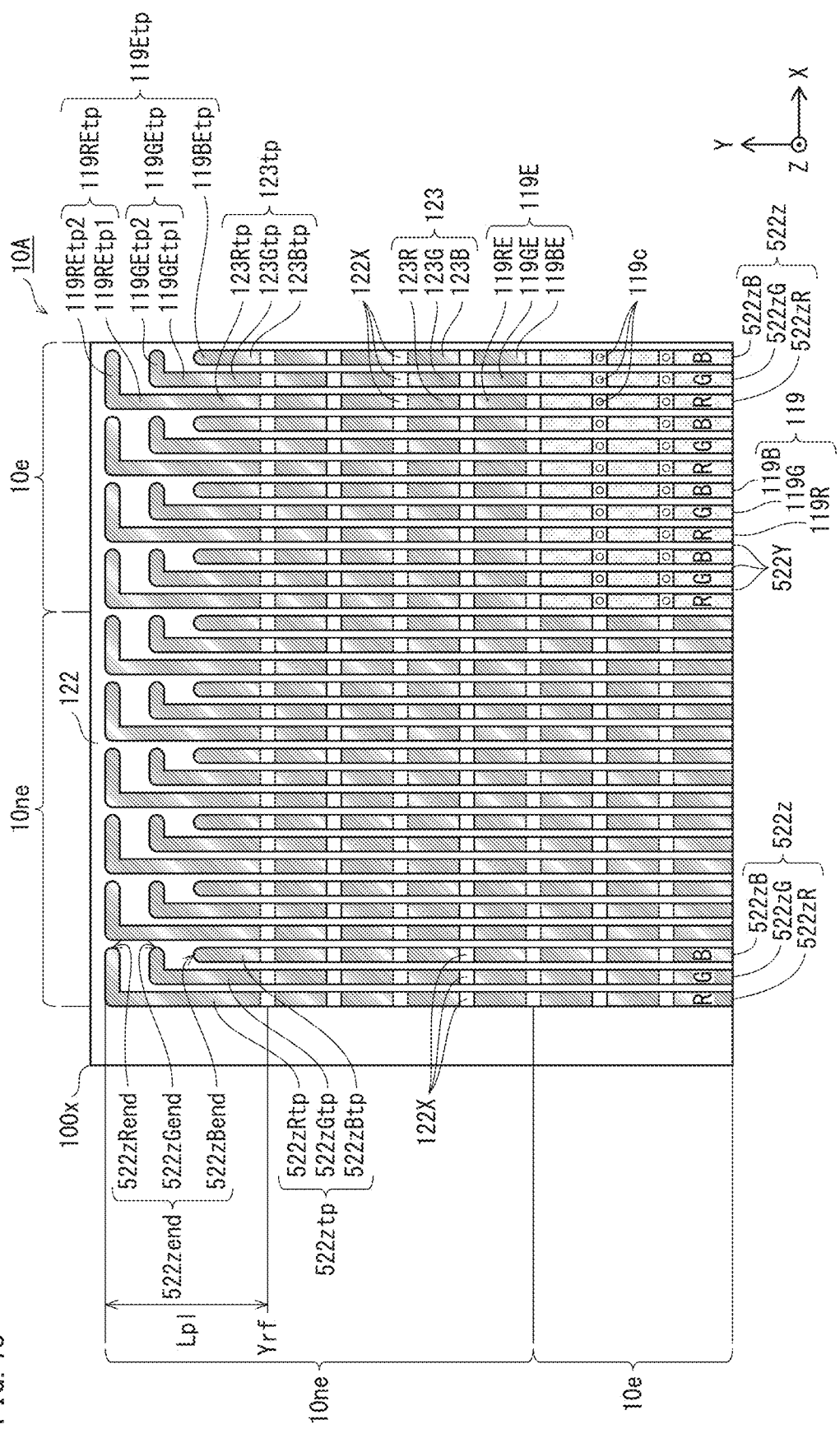
FIG. 18 is a plan view diagram enlargement of a portion of an organic EL display panel 10A according to at least one embodiment corresponding to the portion X1 in FIG. 3.

The following describes a display panel 10A pertaining to Modification 1. FIG. 18 is an enlarged plan view diagram illustrating a portion of the display panel 10A pertaining to Modification 1, the portion corresponding to the portion X1 in FIG. 3. The display panel 10A pertaining to Modification 1 has a structure in which, in plan view of the substrate 100x, at least a first gap end region 522zRtp and a second gap end region 522zGtp bend in the row direction. In the first gap end region 522zRtp are formed a dummy electrode 119REtp1 and a dummy electrode 119REtp2 (bend portion), and in the second gap end region 522zGtp are formed a dummy electrode 119GEtp1 and a dummy electrode 119GEtp2 (bend portion). These points are differences from the display panel 10 pertaining to at least one embodiment, but other structure is the same as that of the display panel 10. According to the display panel 10A, even in a case where length in the column direction of the substrate 100x is less than that of the display panel 10, the distance between the column direction end portion of the gaps 522z in the region 10e and the column direction ends 522zend of the gaps 522z can be set such that the distance for the gaps 522zR>the distance for the gaps 522zG>the distance for the gaps 522zB. As a result, in the display panel 10A, even when the region 10ne is narrow, in an order of magnitude R>G>B, the influence of film thickness increase in the column direction ends 522zend of the gaps 522z of portions of the light emitting layers 123 in the column direction end portion of the region 10e can be reduced, and the same effect as that of the display panel 10 pertaining to at least one embodiment can be achieved.

(2) Modification 2

Figure 19:
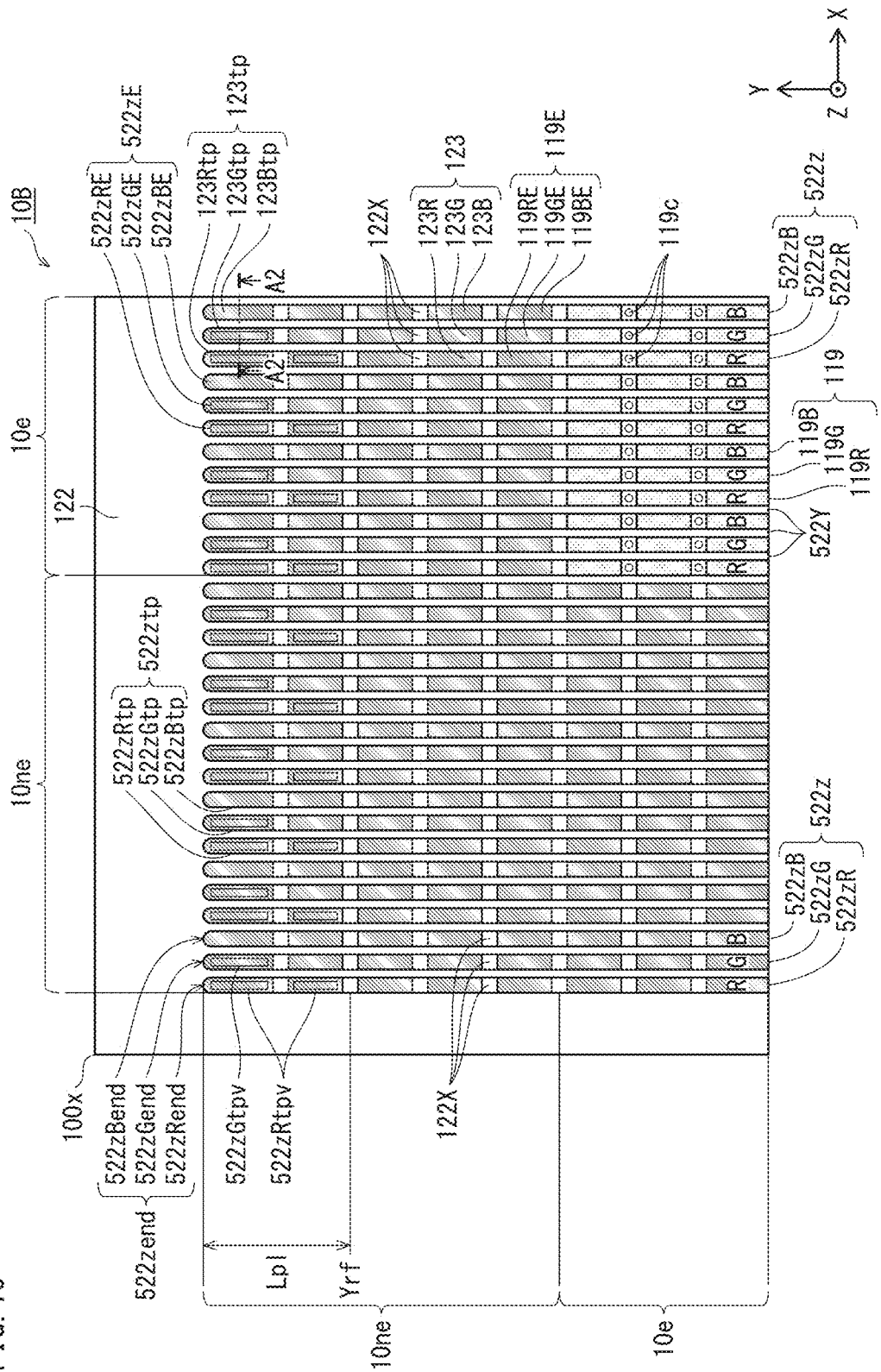
FIG. 19 is a plan view diagram enlargement of a portion of an organic EL display panel 109 according to at least one embodiment corresponding to the portion X1 in FIG. 3.
Figure 20:
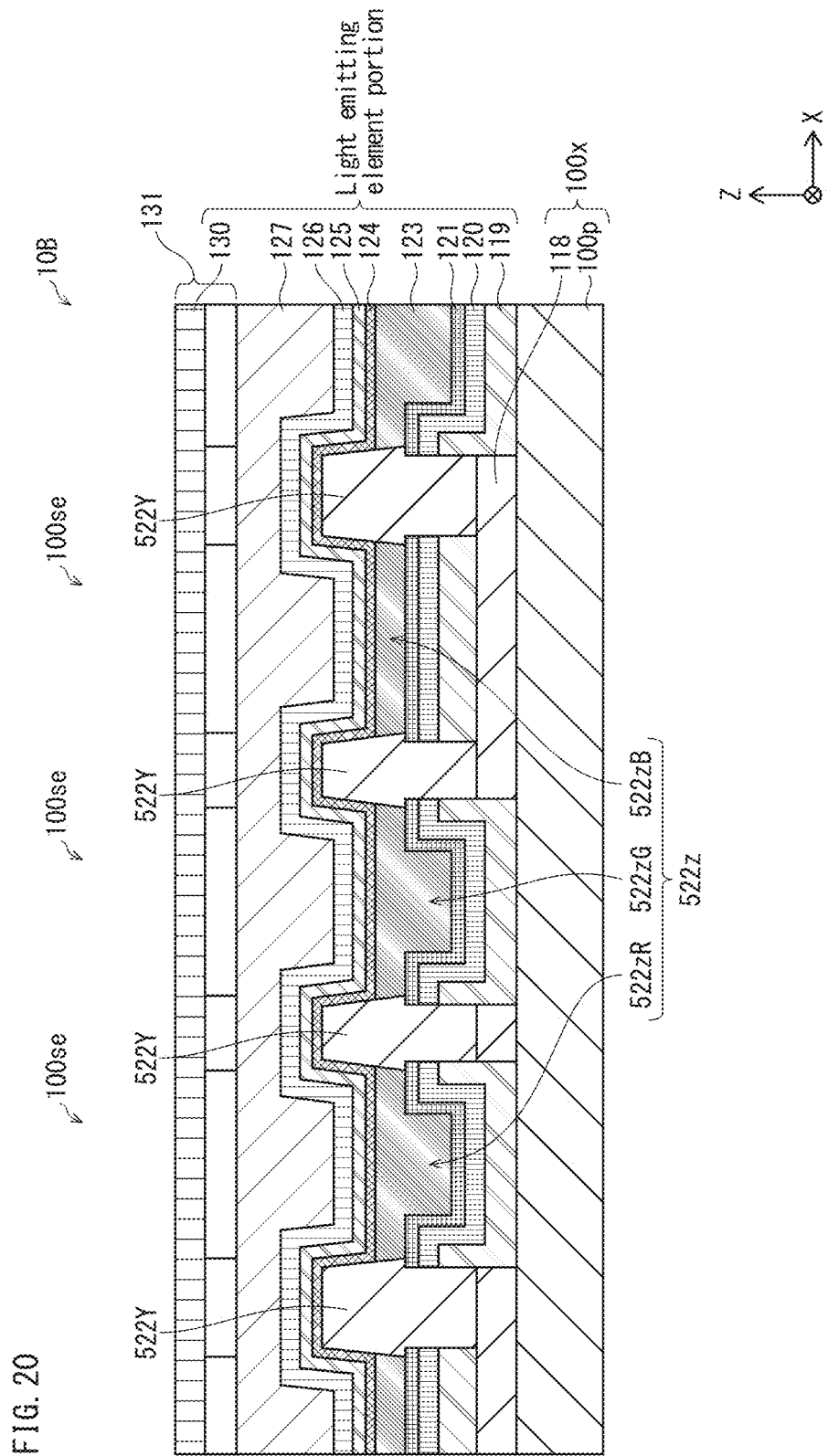
FIG. 20 is a schematic cross-section diagram of a cross-section taken along A2-A2 in FIG. 19 of organic EL display panel 10B according to at least one embodiment.

The following describes a display panel 10B pertaining to Modification 2. FIG. 19 is an enlarged plan view diagram illustrating a portion of the display panel 10B pertaining to Modification 2, the portion corresponding to the portion X1 in FIG. 3. FIG. 20 is a schematic cross-section diagram of the display panel 10B illustrating a cross-section taken along A2-A2 in FIG. 19. The display panel 10B pertaining to Modification 2 is different from the display panel 10 pertaining to at least one embodiment in that, in plan view of the substrate 100x, position in the column direction of the column direction ends 522zend of the gaps 522z in the region 10ne on the substrate 100x does not change, regardless of light emission color of the light emitting layers 123 in the gaps 522z. In addition, the structure is different from that of the display panel 10 pertaining to at least one embodiment in that volume of a portion of the first gap end region 522zRtp sandwiched by the column banks 522Y is larger than volume of a portion of the second gap end region 522zGtp sandwiched by the column banks 522Y. Further, the volume of the portion of the second gap end region 522zGtp sandwiched by the column banks 522Y may be larger than volume of a portion of a third gap end region 522zBtp sandwiched by the column banks 522Y. Otherwise, structure of the display panel 10B is the same as that of the display panel 10.

According to the display panel 10B, as illustrated in FIG. 20, a portion of the planarizing layer 118 corresponding to at least one region selected from the first gap end region 522zRtp and the second gap end region 522zGtp is recessed. By recessing the portion of the planarizing layer 118, the corresponding volumes between adjacent ones of the column banks 522Y and the top surface of the substrate 100x are increased, and when forming the light emitting layers 123, larger volumes of ink can be held.

According to the display panel 10B, as illustrated in FIG. 19, in the first gap end region 522zRtp a portion 522zRtpv corresponding to two of the dummy electrodes 119E is a recessed portion, in the second gap end region. 522zGtp a portion 522zGtpv corresponding to one of the dummy electrodes 119E is a recessed portion, and in the third gap end region 522zBtp there is no recessed portion.

With this structure, in the display panel 10B, the volume of a portion in the gap end region 522ztp sandwiched by the column banks 522Y can be set such that the volume of the first gap end region 522zRtp>the volume of the second gap end region 522zGtp>the volume of the third gap end region 522zBtp. Thus, in forming the light emitting layers 123, volumes of the inks 123RI, 123GI, 123BI including the R, G, B organic light emitting materials held in the first gap end region 522zRtp, the second gap end region 522zGtp, and the third gap end region 522zBtp can be increased.

Thus, an effect can be obtained that amounts of solid content in the inks in the gap end regions 522ztp of the gaps 522z can be set such that the solid content of the ink 123RI>the solid content of the ink 123GI>the solid content of the ink 123BI. As a result, it is possible to suppress a factor of film thickness increase becoming conspicuous near the column direction ends of the region 10e in the order of magnitude the light emitting layers 123R>the light emitting layers 123G>the light emitting layers 123B. Thus, in the display panel 10B, a degree of increase in film thickness near the column direction ends of the region 10e can be made comparable between RGB colors of the light emitting layers 123, and near the column direction ends of the display element region 10e, differences between R, G, and B of luminance unevenness near the column direction ends for each color can be reduced, and uneven light emission properties near the column direction ends can be suppressed.

(3) Modification 3

Figure 21:
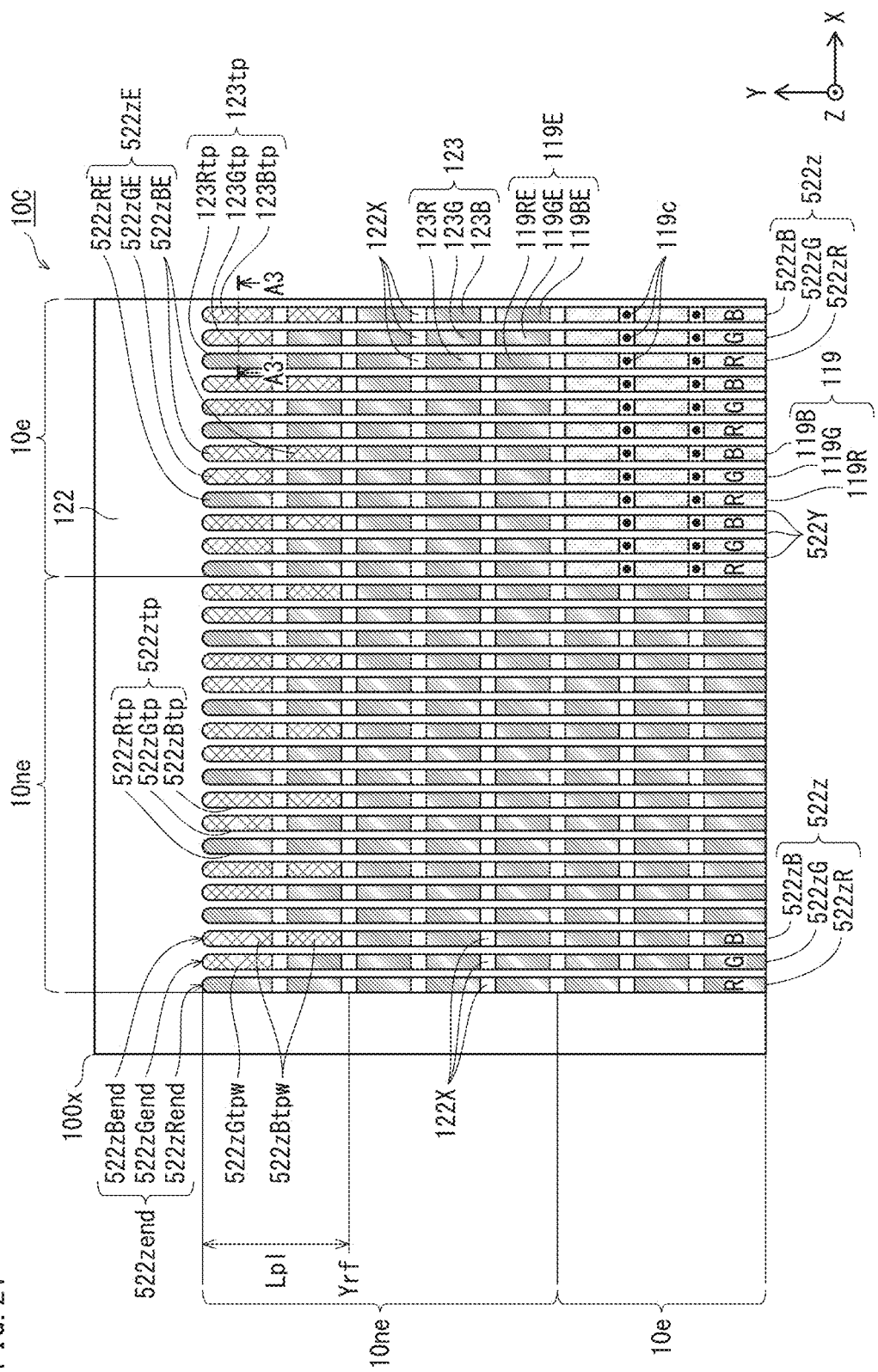
FIG. 21 is a plan view diagram enlargement of a portion of an organic EL display panel 10C according to at least one embodiment corresponding to the portion X1 in FIG. 3.
Figure 22:
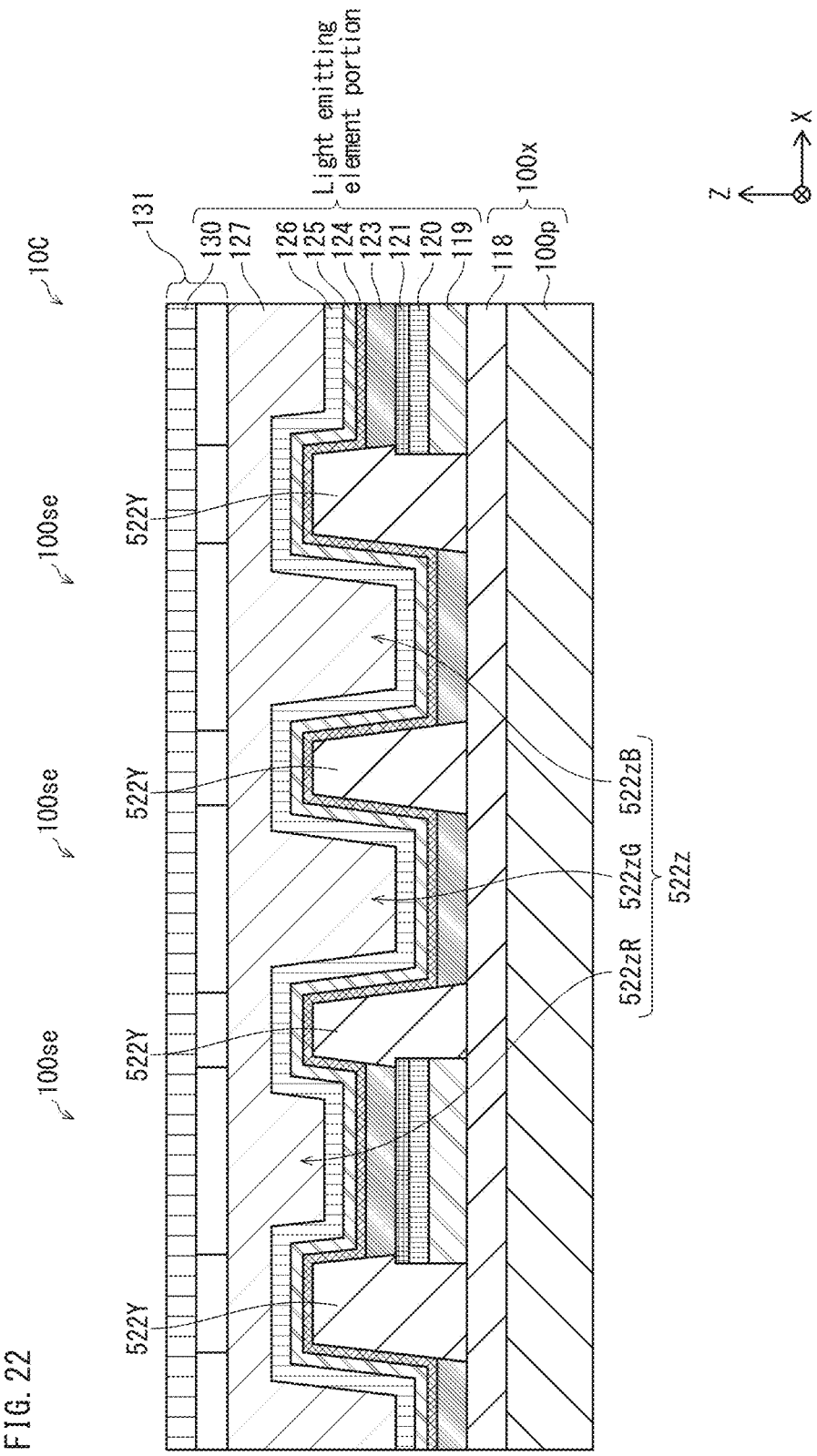
FIG. 22 is a schematic cross-section diagram of a cross-section taken along A3-A3 in FIG. 21 of organic EL display panel 10B according to at least one embodiment.

The following describes a display panel 10C pertaining to Modification 3. FIG. 21 is an enlarged plan view diagram illustrating a portion of the display panel 10C pertaining to Modification 3, the portion corresponding to the portion X1 in FIG. 3. FIG. 22 is a schematic cross-section diagram of the display panel 10C illustrating a cross-section taken along A3-A3 in FIG. 21. The display panel 10C is different from the display panel 10 pertaining to at least one embodiment in that, in plan view of the substrate 100x, positions in the column direction of the column direction ends 522zend of the gaps 522z in the region 10ne on the substrate 100x are the same regardless of light emission colors of the light emitting layers 123 disposed in the gaps 522z. In addition, the display panel 10C is different from the display panel 10 pertaining to at least one embodiment in that, of the first gaps 522zR and the second gaps 522zG, in at least the second gap end region 522zGtp of the second gaps 522zG, a light-emitting-layer-present-region is present, in which the dummy electrodes 119E are not present and corresponding ones of the light emitting layers 123 are present on a top surface of the planarizing layer 118 of the substrate 100x. Further, in plan view of the substrate 100x, a total area of the light-emitting-layer-present-region in the second gap end region 522zGtp is greater than a total area of the light-emitting-layer-present-region in the first gap end region 522zRtp, where the light-emitting-layer-present-region is not present. Further, the light-emitting-layer-present-region is present in at least the third gap end region 522zBtp of the third gaps 522zB, and in plan view, a total area of the light-emitting-layer-present-region in the third gap end region 522zBtp is greater than the total area of the light-emitting-layer-present-region in the second gap end region. 522zGtp. Otherwise, structure of the display panel 10B is the same as that of the display panel 10.

According to the display panel 10C, as illustrated in FIG. 22, the dummy electrodes 119E are not present on the planarizing layer 118 of the substrate 100x in portions corresponding to the second gap end region 522zGtp and the third gap end region 522zBtp, and in said portions (light-emitting-layer-present-region), the light emitting layers 123 are in direct contact with the top surface of the planarizing layer 118 of the substrate 100x. The planarization layer 118, which is made of resin, has a high liquid repellency with respect to the light emitting layers 123, and an amount of ink applied to the top surface of the planarizing layer 118 in each of said portions (light-emitting-layer-present-region) is relatively small when compared to an amount applied onto one of the dummy electrodes 119E. Accordingly, thicknesses of the light emitting layers 123 formed by drying ink on the top surface of the planarizing layer 118 of said portions (light-emitting-layer-present-region) are also relatively small when compared to thicknesses of the light emitting layers 123 formed on the dummy electrodes 119E.

According to the display panel 10C, as illustrated in FIG. 21, in the third gap end region 522zBtp, a portion 522zBtpw corresponding to two of the dummy electrodes 119E forms a light-emitting-layer-present-region, in the second gap end region 522zGtp, a portion 522zGtpw corresponding to one of the dummy electrodes 119E forms a light-emitting-layer-present-region, and in the first gap end region 522zRtp there is no light-emitting-layer-present-region. Thus, in the display panel 109, an amount of ink applied per unit area on the gap end regions 522ztp can be set such that the amount for the first gap end region 522zRtp>the amount for the second gap end region 522zGtp>the amount for the third gap end region 522zBtp. Thus, in forming the light emitting layers 123, volumes of the inks 123RI, 123GI, 123BI including the R, G, B organic light emitting materials held in the first gap end region 522zRtp, the second gap end region 522zGtp, and the third gap end region 522zBtp can be increased in the order R, G, B.

According to this structure, similarly to Modification 2, an effect can be achieved such that, in the gap end regions 522ztp of the gaps 522z, an amount of solid content included in the ink can be set such that the amount in the ink 123RI>the amount in the ink 123GI>the amount in the ink 123BI. As a result, according to the display panel 10C, it is possible to suppress a factor of film thickness increase becoming conspicuous near the column direction ends of the region 10e in the order of magnitude the light emitting layers 123R>the light emitting layers 123G>the light emitting layers 123B, and a degree of film thickness increase near the column direction ends of the substrate 10e can be made comparable between RGB colors of the light emitting layers 123.

(4) Modification 4

Figure 23:
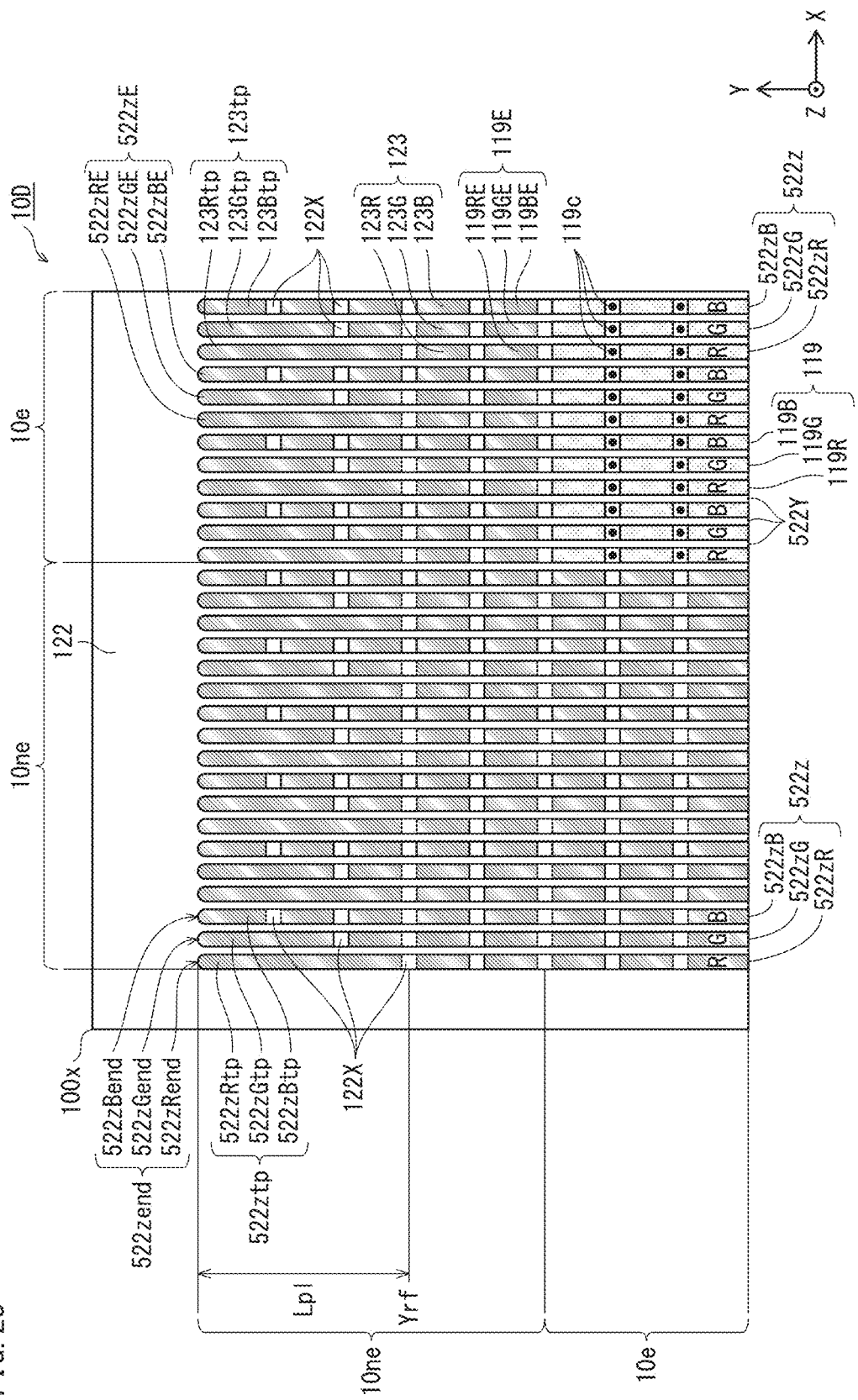
FIG. 23 is a plan view diagram enlargement of a portion of an organic EL display panel 10D according to at least one embodiment corresponding to the portion X1 in FIG. 3.

The following describes a display panel 10D pertaining to Modification 4. FIG. 23 is an enlarged plan view diagram illustrating a portion of the display panel 10D pertaining to Modification 4, the portion corresponding to the portion X1 in FIG. 3. The display panel 10D is different from the display panel 10 pertaining to at least one embodiment in that, in plan view of the substrate 100x, positions in the column direction of the column direction ends 522zend of the gaps 522z in the region 10ne on the substrate 100x are the same regardless of light emission colors of the light emitting layers 123 disposed in the gaps 522z. In addition, the display panel 10D is different from the display panel 10 pertaining to at least one embodiment in that a plurality of the row banks 122x are disposed above the substrate 100x at least between column direction ends of the dummy electrodes 119E, and a total number of the row banks 122x in the second gap end region 522zGtp is greater than a total number of the row banks 122x in the first gap end region 522zRtp. Further, a total number of the row banks 122x in the third gap end region 522zBtp may be greater than the total number of the row banks 122x in the second gap end region 522zGtp. Otherwise, structure of the display panel 10D is the same as that of the display panel 10.

According to the display panel 10D, providing the row banks 122x above the substrate 100x in positions between column direction ends of the dummy pixels 119E in the second gap end region 522zGtp and the third gap end region 522zBtp has a function of regulating amounts of ink flowing into the gap end regions 522ztp. The row banks 122x, which are made of resin, have affinity for the light emitting layers 123, but by providing the row banks 122x, which have a defined height, amounts of ink flowing into the gap end regions 522ztp are made relatively small when compared to a case where the row banks 122x are not present in said positions. Accordingly, film thicknesses of the light emitting layers 123 formed by drying ink in the gap end regions 522ztp having a greater number of the row banks 122x are relatively low when compared to film thicknesses of the light emitting layers 123 formed by drying ink in the gap end regions 522ztp having a lower number of the row banks 122x.

According to display panel 10D, as illustrated in FIG. 23, there are two of the row banks 122x between dummy pixels in the third gap end region 522zBtp, one of the row banks 122x between dummy pixels in the second gap end region 522zGtp, and none of the row banks 122x in the first gap end region 522zGtp.

Thus, in the display panel 10D, an amount of ink applied per unit area on the gap end regions 522ztp can be set such that the amount for the first gap end region 522zRtp>the amount for the second gap end region 522zGtp>the amount for the third gap end region 522zBtp. Thus, in forming the light emitting layers 123, volumes of the inks 123RI, 123GI, 123BI including the R, G, B organic light emitting materials held in the first gap end region 522zRtp, the second gap end region 522zGtp, and the third gap end region 522zBtp can be increased in the order R, G, B.

Thus, according to the display panel 10D, as per Modifications 2 and 3, in the gap end regions 522ztp of the gaps 522z, an amount of solid content included in the ink can be set such that the amount in the ink 123RI>the amount in the ink 123GI>the amount in the ink 123BI, and therefore degrees of film thickness increase near column direction ends of the region 10e can be made comparable between the light emitting layers 123 of each of the colors RGB.

(5) Other Modifications

In the display panel 10 pertaining to at least one embodiment, the colors of light emitted by the light emitting layers 123 of the sub pixels 100se in the gaps 522z between the column banks 522Y that are adjacent in the row direction are different from each other, and the colors of light emitted by the light emitting layers 123 of the sub pixels 100se in gaps between the row banks 122X that are adjacent in the column direction are the same. However, the colors of light emitted by the light emitting layers 123 of the sub pixels 100se that are adjacent in the row direction may be the same, and the colors of light emitted by the light emitting layers 123 of the sub pixels 100se that are adjacent in the column direction may be different from each other.

According to the display panel 10 pertaining to at east one embodiment, there is a red subpixel, a green subpixel, and a blue subpixel in each of the pixels 100e, but the present disclosure is not limited to this example. As another example, the light emitting layers may all be of a single type, or there may he four types emitting colors of light such as red, green, blue, and white.

Further, according to at least one embodiment, the unit pixels 100e are arranged in a matrix, but the present invention is limited in this way. For example, the effects of the present disclosure can be achieved even when spacing between pixel regions is at one pitch, and adjacent pixel regions similarly spaced are shifted by a half pitch in the column direction. For high resolution display panels, some shift in the column direction is hard to visually determine, and even if some film thickness variation is lined up on a straight line (or staggered line) of a certain thickness, it will appear as a band. Accordingly, even with such a configuration, display quality of a display panel can he increased by suppressing lining up of luminance unevenness along a staggered line.

Further, according to at least one embodiment, the hole injection layers 120, the hole transport layers 121, the light emitting layers 123, and the electron transport layer 124 are present between the pixel electrodes 119 and the common electrode layer 125, but the present disclosure is not limited to this structure. For example, a structure is possible in which only the light emitting layers 123 are present between the pixel electrodes 119 and the common electrode layer 125, without use of the hole injection layers 120, the hole transport layers 121, and the electron transport layer 124. Further, for example, a structure is possible in which a layer or a plurality of layers selected from the group consisting of hole injection layers, hole transport layers, an electron transport layer, and an electron injection layer are present. Further, all said layers need not be made of organic compounds, and at least one layer may be made of an inorganic compound.

Further, according to at least one embodiment, a structure is used in which the pixel electrodes 119, which are anodes, are disposed below the EL element portions and connected to the wiring 110 that is connected to the TFT source electrodes, but a structure may be used in which a common electrode layer is disposed below the EL element portions and anodes are disposed above. In such a case, cathodes disposed below the EL element portions are connected to drains of the TFTs.

Further, according to at least one embodiment, a structure is used in which two transistors $Tr_1$, $Tr_2$ are provided for each of the sub pixels 100se, but the present disclosure is not limited to this. For example, a structure may be used in which a single transistor or three or more transistors correspond to one subpixel.

Further, according to at least one embodiment, a top-emission type of EL display panel is given as an example, but the present disclosure is not limited to this. For example, a bottom-emission type of the display panel or the like can be used. In such a case, each structure can be changed appropriately.

<<Conclusion>>

According to the organic EL display panel and the organic EL display panel manufacturing method pertaining to aspects of the present disclosure, unevenness in light emission properties near column direction end portions can be suppressed by the reduction in variation in film thicknesses of organic light emitting layers near the column direction end portions.

<<Supplement>>

The embodiments described above each indicate one beneficial specific example of the present disclosure. Numerical values, shapes, materials, constituent elements, arrangement positions and connections of constituent elements, steps, order of steps, and the like indicated as embodiments are merely examples and are not intended to limit the present disclosure. Further, among constituent elements in the embodiments, any elements not described in independent claims representing top level concepts of the present disclosure are described as constituent elements constituting a more beneficial embodiment.

Further, the order described above in which steps are executed is for illustrative purposes, and the steps may be in an order other than described above. Further, a portion of the steps described above may be executed simultaneously (in parallel) with another step.

Further, in order to facilitate understanding of the disclosure, constituent elements in each drawing referenced by description of an embodiment are not necessarily drawn to scale. Further, the present disclosure is not limited to the description of the embodiments, and can be appropriately changed without departing from the scope of the present disclosure.

Further, at least a portion of functions of each embodiment and each modification may be combined.

Further, the present disclosure includes various modifications of the embodiments that are within the scope of ideas conceivable by a person skilled in the art.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included herein.

What is claimed is:

1. An organic electroluminescence (EL) display panel in which pixels are arranged in a matrix of rows and columns, the organic EL display panel comprising:
   a substrate;
   individual electrodes disposed above the substrate and arranged in the matrix;
   column banks disposed above the substrate at least between row direction edges of the individual electrodes, the column banks extending in the column direction and arranged side by side along the row direction;
   organic light emitting layers disposed in gaps between the column banks, the organic light emitting layers each being continuous in the column direction between column direction ends of the column banks, wherein a first organic light emitting layer among the organic light emitting layers is disposed in a first gap selected from the gaps and a second organic light emitting layer among the organic light emitting layers is disposed in a second gap selected from the gaps, the second gap being adjacent to the first gap in the row direction with one of the column banks therebetween; and a counter electrode layer disposed above the organic light emitting layers, wherein the individual electrodes consist of pixel electrodes disposed in a display region centrally located in plan view of the substrate and dummy electrodes disposed in a peripheral region surrounding the display region, and in plan view of the substrate, the first organic light emitting layer in a first gap end region extending in the column direction from a column direction end of the first gap to a reference position a defined distance from the column direction end of the first gap towards the display region and within the peripheral region has a volume greater than a volume of the second organic light emitting layer in a second gap end region extending in the column direction from a column direction end of the second gap to the reference position.

2. The organic EL display panel of claim 1, wherein average film thickness of the first organic light emitting layer in the display region is greater than average film thickness of the second organic light emitting layer in the display region.

3. The organic EL display panel of claim 1, wherein a wavelength of light emitted by the first organic light emitting layer is longer than a wavelength of light emitted by the second organic light emitting layer.

4. The organic EL display panel of claim 1, wherein a ratio of the volume of the first organic light emitting layer in the first gap end region to average film thickness in the display region of the first organic light emitting layer is greater than a ratio of the volume of the second organic light emitting layer in the second gap end region to average film thickness in the display region of the second organic light emitting layer.

5. The organic EL display panel of claim 1, wherein length in the column direction of the first gap end region is greater than length in the column direction of the second gap end region.

6. The organic EL display panel of claim 1, wherein in plan view of the substrate, at least one region selected from the first gap end region and the second gap end region bends in the row direction.

7. The organic EL display panel of claim 1, wherein a portion of a top surface of the substrate corresponding to at least one region selected from the first gap end region and the second gap end region is recessed.

8. The organic EL display panel of claim 7, wherein a volume defined by the top surface of the substrate and adjacent banks of the column banks in the first gap end region is greater than a volume defined by the top surface of the substrate and adjacent banks of the column banks in the second gap end region.

9. The organic EL display panel of claim 1, wherein at least one region selected from the second gap end region and the first gap end region is a light-emitting-layer-present-region in which the dummy electrodes, which have a layer structure in common with the pixel electrodes, are not present and the light emitting layers can be in direct contact with a top surface of the substrate, and in plan view of the substrate, a total area of the light-emitting-layer-present-region in the second gap end region is larger than a total area of the light-emitting-layer-present-region in the first gap end region.

10. The organic EL display panel of claim 1, further comprising row banks disposed above the substrate at least between column direction edges of the individual electrodes, the row banks extending in the row direction and arranged side by side along the column direction, wherein a total number of the row banks in the second gap end region is greater than a total number of the row banks in the first gap end region.

11. The organic EL display panel of claim 1, wherein the first organic light emitting layer and the second organic light emitting layer at the same position in the column direction are included in the same pixel.

12. The organic EL display panel of claim 1, further comprising a third organic light emitting layer among the organic light emitting layers disposed in a third gap selected from the gaps, the third gap being adjacent to the second gap in the row direction with one of the column banks therebetween and different from the first gap, wherein an average film thickness of the second organic light emitting layer in the display region is greater than an average film thickness of the third light emitting layer in the display region, and in plan view of the substrate, the second organic light emitting layer in the second gap end region has a volume greater than a volume of the third organic light emitting layer in a third gap end region extending in the column direction from a column direction end of the third gap to the reference position.

13. The organic EL display panel of claim 12, wherein a wavelength of light emitted by the second organic light emitting layer is longer than a wavelength of light emitted by the third organic light emitting layer.

14. The organic EL display panel of claim 12, wherein the first organic light emitting layer, the second organic light emitting layer, and the third organic light emitting layer at the same position in the column direction are included in the same pixel.

15. A method of manufacturing an organic electroluminescence (EL) display panel in which pixels are arranged in a matrix of rows and columns, the method comprising:

preparing a substrate;

forming individual electrodes above the substrate arranged in the matrix;

forming column banks above the substrate at least between row direction edges of the individual electrodes, the column banks extending in the column direction and arranged side by side along the row direction;

applying, into gaps between the column banks including a first gap and a second gap, a first ink including a first organic light emitting material to an entire length of the first gap between column direction ends of the column banks and applying a second ink including a second organic light emitting material to an entire length of the second gap between column direction ends of the column banks, the second gap being adjacent to the first gap in the row direction with one of the column banks therebetween and the second organic light emitting material being different from the first organic light emitting material;

forming organic light emitting layers including forming a first organic light emitting layer by drying the first ink and forming a second organic light emitting layer by drying the second ink; and forming a counter electrode layer above the organic light emitting layers, wherein the individual electrodes consist of pixel electrodes and dummy electrodes, and in the forming of the individual electrodes, the pixel electrodes are disposed in a display region centrally located in plan view of the substrate and the dummy electrodes are disposed in a peripheral region surrounding the display region, and in the forming of the organic light emitting layers, in plan view of the substrate, the first organic light emitting layer in a first gap end region extending in the column direction from a column direction end of the first gap to a reference position a defined distance from the column direction end of the first gap towards the display region and within the peripheral region is made to have a volume greater than a volume of the second organic light emitting layer in a second gap end region extending in the column direction from a column direction end of the second gap to the reference position.

16. The method of claim 15, wherein
in the forming of the organic light emitting layers, average film thickness of the first organic light emitting layer in the display region is made to be greater than average film thickness of the second organic light emitting layer in the display region.

17. The method of claim 15, wherein
in the applying of the first ink and the second ink, concentration of the first ink is higher than concentration of the second ink.

18. The method of claim 15, wherein
a wavelength of light emitted by the first organic light emitting layer is made to be longer than a wavelength of light emitted by the second organic light emitting layer.

19. The method of claim 15, wherein
in the forming of the column banks, length in the column direction of the first gap end region is made to be greater than length in the column direction of the second gap end region.

20. The method of claim 15, wherein
in the forming of the column banks, in plan view of the substrate, at least one region selected from the first gap end region and the second gap end region is made to bend in the row direction.

21. The method of claim 15, wherein
in the preparing of the substrate, a volume defined by the top surface of the substrate in the first gap end region and adjacent column banks among the column banks is made to be greater than a volume defined by the top surface of the substrate in the second gap end region and adjacent column banks among the column banks.

22. The method of claim 15, wherein
in the forming of the individual electrodes, at least one region selected from the second gap end region and the first gap end region is a light-emitting-layer-present-region in which the dummy electrodes, which have a layer structure in common with the pixel electrodes, are not present and the light emitting layers can be in direct contact with a top surface of the substrate, and in plan view of the substrate, a total area of the light-emitting-layer-present-region in the second gap end region is made to be larger than a total area of the light-emitting-layer-present-region in the first gap end region.

23. The method of claim 15, further comprising,
after the forming of the individual electrodes, forming row banks above the substrate at least between column direction edges of the individual electrodes, the row banks extending in the row direction and arranged side by side along the column direction, wherein a total number of the row banks in the second gap end region is made to be greater than a total number of the row banks in the first gap end region.

24. The method of claim 15, wherein
a ratio of the volume of the first organic light emitting layer in the first gap end region to average film thickness in the display region of the first organic light emitting layer is made to be greater than a ratio of the volume of the second organic light emitting layer in the second gap end region to average film thickness in the display region of the second organic light emitting layer.

25. The method of claim 15, wherein
the first organic light emitting layer and the second organic light emitting layer at the same position in the column direction are included in the same pixel.

26. The method of claim 15, further comprising
applying a third ink including a third organic light emitting material to an entire length of a third gap selected from the gaps between column direction ends of the column banks, the third gap being adjacent to the second gap in the row direction with one of the column banks therebetween and different from the first gap, the third organic light emitting material being different from the first organic light emitting material and different from the second organic light emitting material, wherein the forming of the organic light emitting layers includes forming a third organic light emitting layer by drying the third ink, an average film thickness of the second organic light emitting layer in the display region is made to be greater than an average film thickness of the third light emitting layer in the display region, and in plan view of the substrate, the second organic light emitting layer in the second gap end region is made to have a volume greater than a volume of the third organic light emitting layer in a third gap end region extending in the column direction from a column direction end of the third gap to the reference position.

27. The method of claim 26, wherein
in the applying of the second ink and the third ink, concentration of the second ink is higher than concentration of the third ink.

28. The method of claim 26, wherein
a wavelength of light emitted by the second organic light emitting layer is made to be longer than a wavelength of light emitted by the third organic light emitting layer.

29. The method of claim 26, wherein
the first organic light emitting layer, the second organic light emitting layer, and the third organic light emitting layer at the same position in the column direction are included in the same pixel.

* * * * *